(12) United States Patent
Chen et al.

(10) Patent No.: US 10,964,655 B2
(45) Date of Patent: Mar. 30, 2021

(54) PATTERNING POLYMER LAYER TO REDUCE STRESS

(71) Applicant: Taiwan Semiconductor Manufacturing Company, Ltd., Hsinchu (TW)

(72) Inventors: Shih-Ming Chen, Jhunan Township (TW); Ching-Tien Su, Chiayi (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/727,325

(22) Filed: Dec. 26, 2019

(65) Prior Publication Data

US 2020/0135674 A1    Apr. 30, 2020

Related U.S. Application Data

(63) Continuation of application No. 16/176,078, filed on Oct. 31, 2018, now Pat. No. 10,522,488.

(51) Int. Cl.

| | | |
|---|---|---|
| *H01L 23/485* | (2006.01) | |
| *H01L 23/00* | (2006.01) | |
| *H01L 21/56* | (2006.01) | |
| *H01L 21/78* | (2006.01) | |
| *H01L 25/10* | (2006.01) | |
| *H01L 23/31* | (2006.01) | |
| *H01L 21/768* | (2006.01) | |

(52) U.S. Cl.
CPC ............ *H01L 24/05* (2013.01); *H01L 21/563* (2013.01); *H01L 21/78* (2013.01); *H01L 23/3142* (2013.01); *H01L 24/03* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 24/96* (2013.01); *H01L 25/105* (2013.01); *H01L 21/568* (2013.01); *H01L 21/76805* (2013.01);

(Continued)

(58) Field of Classification Search
CPC ......... H01L 21/76805; H01L 21/76816; H01L 21/76831; H01L 21/76832; H01L 24/13
See application file for complete search history.

(56) References Cited

U.S. PATENT DOCUMENTS

| | | |
|---|---|---|
| 7,989,356 B2 | 8/2011 | Bao et al. |
| 9,576,912 B1 | 2/2017 | Ma et al. |

(Continued)

FOREIGN PATENT DOCUMENTS

| | | |
|---|---|---|
| CN | 106847788 A | 6/2017 |
| KR | 20160111308 A | 9/2016 |

(Continued)

*Primary Examiner* — George R Fourson, III
(74) *Attorney, Agent, or Firm* — Slater Matsil, LLP

(57) ABSTRACT

A method of forming a semiconductor device includes forming a plurality of metal pads over a semiconductor substrate of a wafer, forming a passivation layer covering the plurality of metal pads, patterning the passivation layer to reveal the plurality of metal pads, forming a first polymer layer over the passivation layer, forming a plurality of redistribution lines extending into the first polymer layer and the passivation layer to connect to the plurality of metal pads, forming a second polymer layer over the first polymer layer, and patterning the second polymer layer to reveal the plurality of redistribution lines. The first polymer layer is further revealed through openings in remaining portions of the second polymer layer.

20 Claims, 27 Drawing Sheets

(52) U.S. Cl.
CPC .. *H01L 21/76816* (2013.01); *H01L 21/76831* (2013.01); *H01L 21/76832* (2013.01); *H01L 23/485* (2013.01); *H01L 24/11* (2013.01); *H01L 24/13* (2013.01); *H01L 2224/024* (2013.01); *H01L 2224/0231* (2013.01); *H01L 2224/02371* (2013.01); *H01L 2224/03002* (2013.01); *H01L 2224/0391* (2013.01); *H01L 2224/0401* (2013.01); *H01L 2224/05124* (2013.01); *H01L 2224/05147* (2013.01); *H01L 2224/1146* (2013.01); *H01L 2224/11334* (2013.01); *H01L 2224/11849* (2013.01); *H01L 2224/13024* (2013.01); *H01L 2224/16145* (2013.01); *H01L 2224/32145* (2013.01); *H01L 2224/73204* (2013.01); *H01L 2224/831* (2013.01); *H01L 2224/92125* (2013.01); *H01L 2225/1023* (2013.01); *H01L 2225/1058* (2013.01); *H01L 2924/3512* (2013.01)

(56) References Cited

U.S. PATENT DOCUMENTS

| | | |
|---|---|---|
| 10,325,872 B2 | 6/2019 | Chen et al. |
| 10,541,218 B2 | 1/2020 | Cheng et al. |
| 2003/0153172 A1 | 8/2003 | Yajima et al. |
| 2009/0278263 A1 | 11/2009 | McCarthy et al. |
| 2010/0140752 A1 | 6/2010 | Marimuthu et al. |
| 2010/0210103 A1 | 8/2010 | Sameshima et al. |
| 2011/0024901 A1 | 2/2011 | Yamashita et al. |
| 2013/0280826 A1* | 10/2013 | Scanlan ............... H01L 23/544 438/15 |
| 2014/0264839 A1 | 9/2014 | Tsai et al. |
| 2016/0133686 A1* | 5/2016 | Liao ........................ H01L 28/60 257/532 |
| 2016/0276284 A1 | 9/2016 | Chen et al. |
| 2017/0250147 A1 | 8/2017 | Yu et al. |
| 2018/0294186 A1 | 10/2018 | Lam |
| 2018/0294213 A1 | 10/2018 | Aoki et al. |
| 2018/0337122 A1 | 11/2018 | Liao et al. |
| 2019/0067229 A1 | 2/2019 | Mphammed et al. |
| 2019/0229028 A1 | 7/2019 | Mohammed et al. |
| 2019/0237423 A1 | 8/2019 | Chen et al. |

FOREIGN PATENT DOCUMENTS

| | | |
|---|---|---|
| TW | 1502663 B | 10/2015 |
| TW | 1611486 B | 1/2018 |
| TW | 201820561 A | 6/2018 |
| WO | 2018066395 A1 | 4/2018 |

* cited by examiner

PATTERNING POLYMER LAYER TO REDUCE STRESS

PRIORITY CLAIM AND CROSS-REFERENCE

This application is a continuation of U.S. patent application Ser. No. 16/176,078, entitled "Patterning Polymer Layer to Reduce Stress," filed on Oct. 31, 2018, which application is incorporated herein by reference.

BACKGROUND

In the formation of integrated circuits, devices such as transistors are formed at the surface of a semiconductor substrate in a wafer. An interconnect structure is then formed over the integrated circuit devices. A metal pad is formed over, and is electrically coupled to, the interconnect structure. A passivation layer and a first polymer layer are formed over the metal pad, with the metal pad exposed through the openings in the passivation layer and the first polymer layer.

A redistribution line is then formed to connect to the top surface of the metal pad, followed by the formation of a second polymer layer over the redistribution line. An Under-Bump-Metallurgy (UBM) is formed extending into an opening in the second polymer layer, wherein the UBM is electrically connected to the redistribution line. A solder ball is then placed over the UBM and reflowed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
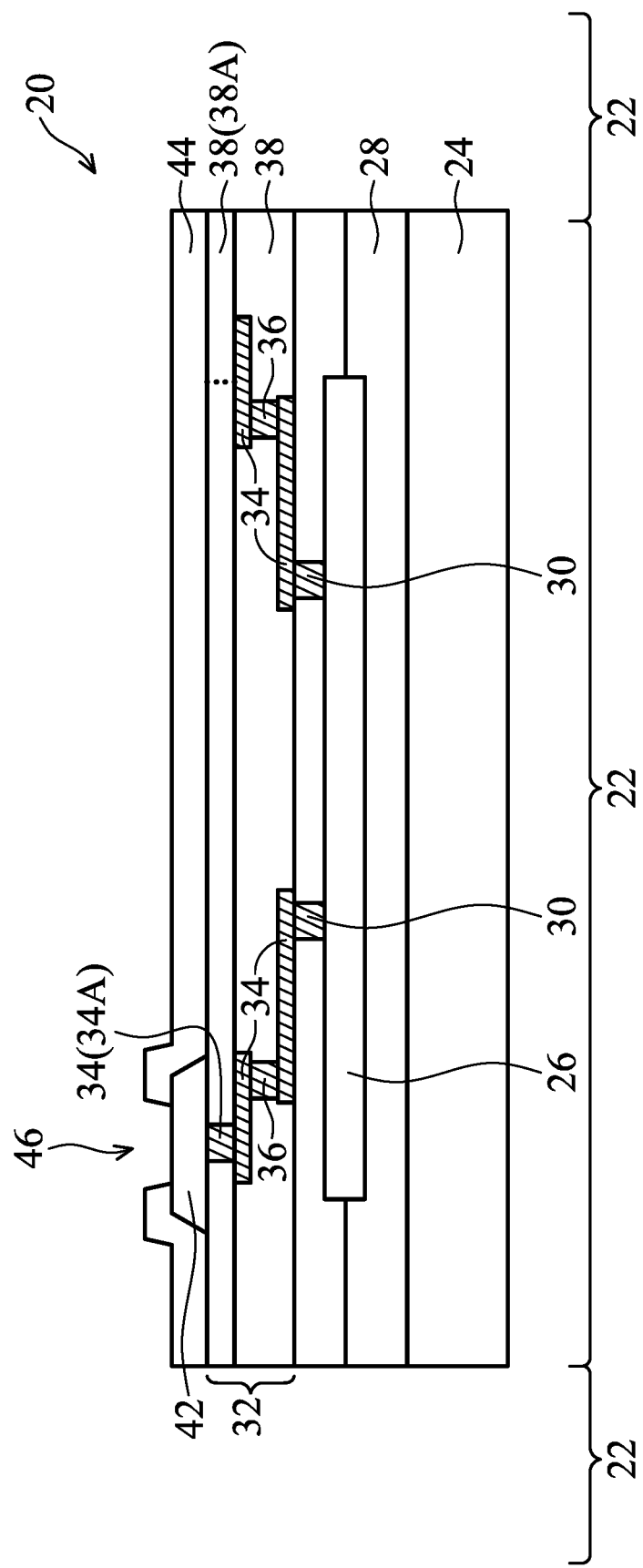
FIGS. 1-3, 4A, 4B, 5, 6A, 6B, 6C and 7-9 illustrate the cross-sectional views and top views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with some embodiments. The intermediate stages in the formation of the package are illustrated in accordance with some embodiments. Some variations of some embodiments are discussed. Throughout the various views and illustrative embodiments, like reference numbers are used to designate like elements. In accordance with some embodiments of the present disclosure, the top polymer layer in a package or a device die is patterned in order to reduce the stress applied by the top polymer layer to underlying layers, so that the reliability of the package is improved.

Figure 24:
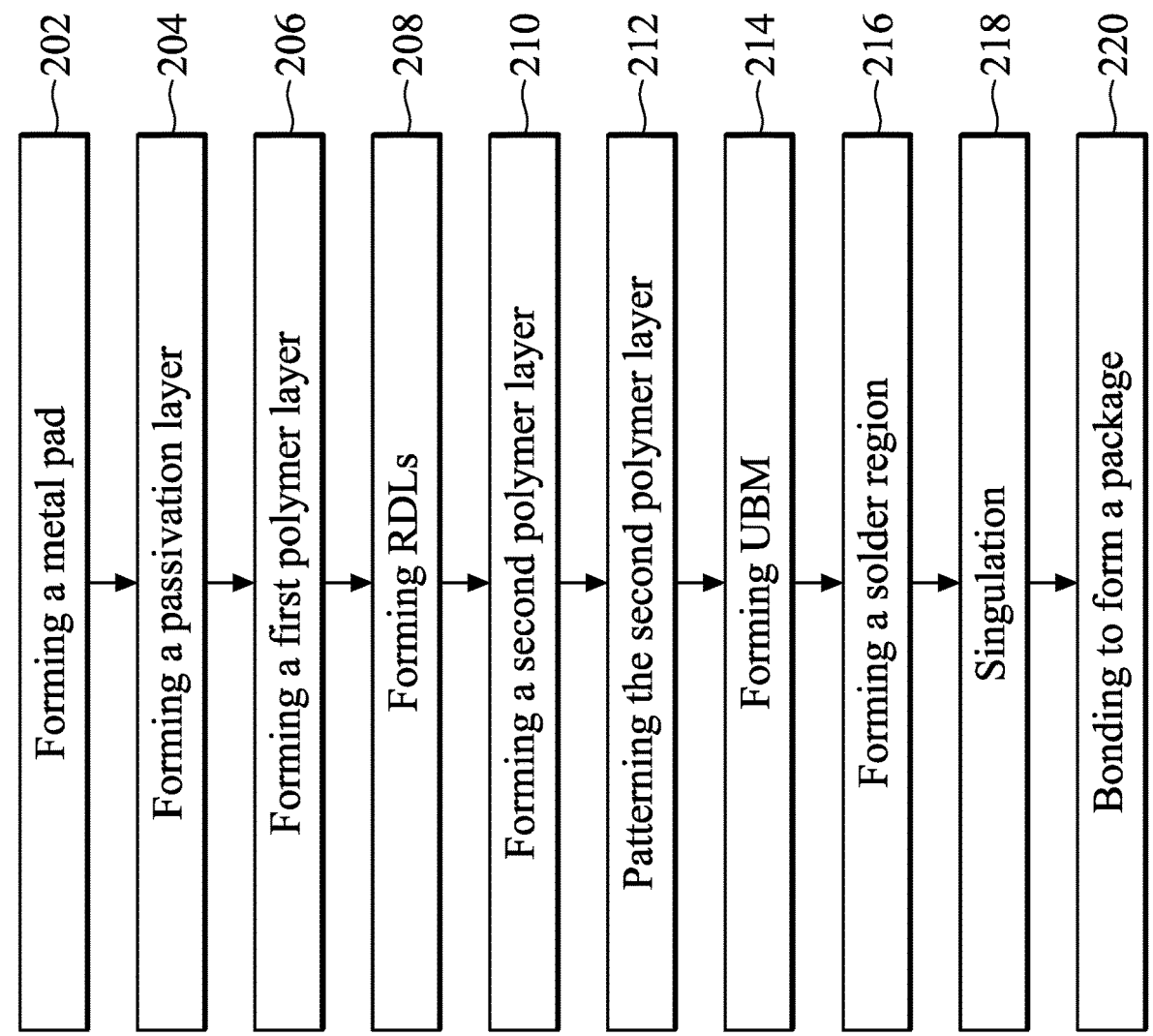
FIG. 24 illustrates a process flow for forming a package in accordance with some embodiments.

FIGS. 1-3, 4A, 4B, 5, 6A, 6B, 6C and 7-9 illustrate the cross-sectional views and top views of intermediate stages in the formation of a package in accordance with some embodiments of the present disclosure. The corresponding processes are also reflected schematically in the process flow 200 as shown in FIG. 24.

FIG. 1 illustrates a cross-sectional view of package component 20. In accordance with some embodiments of the present disclosure, package component 20 is a device wafer including active devices and possibly passive devices, which are represented as integrated circuit devices 26. Device wafer 20 may include a plurality of chips 22 therein, with one of chips 22 illustrated. In accordance with alternative embodiments of the present disclosure, package component 20 is an interposer wafer, which may or may not include active devices and/or passive devices. In accordance with yet alternative embodiments of the present disclosure, package component 20 is a package substrate strip, which includes core-less package substrates or the package substrates with cores therein. In subsequent discussion, a device wafer is discussed as an example of package component 20. The embodiments of the present disclosure may also be applied on interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of crystalline silicon, crystalline germanium, silicon germanium, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may be formed to extend into semiconductor substrate 24, wherein the through-vias are used to electrically inter-couple the features on opposite sides of wafer 20.

In accordance with some embodiments of the present disclosure, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers, and substrate 24 may be a semiconductor substrate or a dielectric substrate.

Inter-Layer Dielectric (ILD) 28 is formed over semiconductor substrate 24 and fills the space between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), Tetra Ethyl Ortho Silicate (TEOS), or the like. ILD 28 may be formed using spin coating, Flowable Chemical Vapor Deposition (FCVD), or the like. In accordance with some embodiments of the present disclosure, ILD 28 is formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of a conductive material selected from tungsten, aluminum, copper, titanium, tantalum, titanium nitride, tantalum nitride, alloys therefore, and/or multi-layers thereof. The formation of contact plugs 30 may include forming contact openings in ILD 28, filling a conductive material(s) into the contact openings, and performing a planarization (such as a Chemical Mechanical Polish (CMP) process or a mechanical grinding process) to level the top surfaces of contact plugs 30 with the top surface of ILD 28.

Over ILD and contact plugs 30 is interconnect structure 32. Interconnect structure 32 includes metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material and then performing a curing process to drive out the porogen, and hence the remaining dielectric layers 38 are porous.

Metal lines 34 and vias 36 are formed in dielectric layers 38. The formation process may include single damascene and/or dual damascene processes. In a single damascene process, a trench is first formed in one of dielectric layers 38, followed by filling the trench with a conductive material. A planarization such as a Chemical Mechanical Polish (CMP) process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features such as metal lines, metal pads, or vias (denoted as 34A) in a top dielectric layer, which is in one of dielectric layers 38 (marked as dielectric layer 38A). In accordance with some embodiments, dielectric layer 38A is formed of a low-k dielectric material similar to the material of lower ones of dielectric layers 38. In accordance with other embodiments, dielectric layer 38A is formed of a non-low-k dielectric material, which may include silicon nitride, Undoped Silicate Glass (USG), silicon oxide, or the like. Dielectric layer 38A may also have a multi-layer structure including, for example, two USG layers and a silicon nitride layer in between. Top metal features 34A may also be formed of copper or a copper alloy, and may have a dual damascene structure or a single damascene structure. Dielectric layer 38A is sometimes referred to as a passivation layer.

Metal pads 42 are formed over and contacting metal features 34A. The respective process is shown as process 202 in the process flow shown in FIG. 24. The illustrated metal pad 42 represents a plurality of metal pads at the same level. Metal pads 42 may be electrically coupled to integrated circuit devices 26 through conductive features such as metal lines 34 and vias 36 in accordance with some embodiments. Metal pads 42 may be aluminum pads or aluminum-copper pads, and other metallic materials may be used. In accordance with some embodiments of the present disclosure, metal pads 42 have an aluminum percentage greater than about 95 percent.

A patterned passivation layer 44 is formed over interconnect structure 32. The respective process is shown as process 204 in the process flow shown in FIG. 24. Some portions of passivation layer 44 may cover the edge portions of metal pads 42, and the central portions of the top surfaces of metal pads 42 are exposed through openings 46 in passivation layer 44. Passivation layer 44 may be a single layer or a composite layer, and may be formed of a non-porous material. In accordance with some embodiments of the present disclosure, passivation layer 44 is a composite layer including a silicon oxide layer and a silicon nitride layer over the silicon oxide layer.

Figure 2:
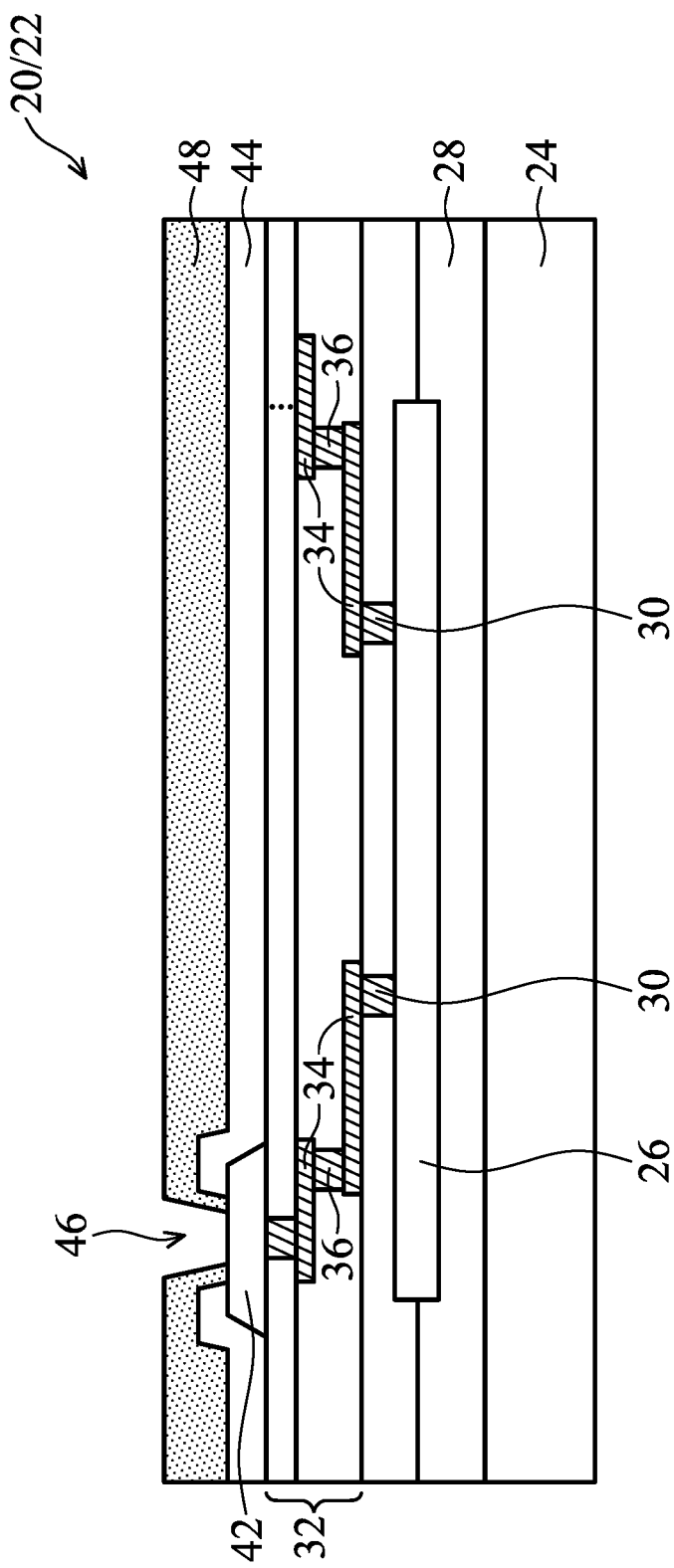

FIG. 2 illustrates the formation of dielectric layer 48. In accordance with some embodiments of the present disclosure, dielectric layer 48 is formed of a polymer such as polyimide, polybenzoxazole (PBO), benzocyclobutene (BCB), or the like. In accordance with some embodiments of the present disclosure, dielectric layer 48 is formed of an inorganic dielectric material such as silicon oxide, silicon nitride, silicon oxynitride, or the like. In subsequent discussion, dielectric layer 48 is referred to as polymer layer 48, while it can be formed of other materials. The respective process is shown as process 206 in the process flow shown in FIG. 24. Polymer layer 48 is patterned, so that the central portions of metal pads 42 are exposed. Polymer layer 48 may be formed of a light-sensitive material such as a photo resist, which may be a negative photo resist or a positive photo resist. The formation and the patterning of polymer layer 48 may include spin-coating polymer layer 48, pre-baking polymer layer 48, performing a light-exposure process and a development process on polymer layer 48, and performing another baking process to cure polymer layer 48. In accordance with some embodiments in which polymer layer 48 is formed of PBO, the pre-baking may be performed at a temperature in the range between about 100 degrees and about 180 degrees. The pre-baking duration may be in the range between about 15 minutes and about 45 minutes. The light exposure is performed using a lithography mask (not shown) having transparent patterns and opaque patterns, which define the patterns of openings 46. After the light exposure, the development process is performed to remove some portions of polymer layer 48, so that openings 46 are revealed exposing the underlying metal pads 42. In accordance with some embodiments, the openings 46 in polymer layer 48 are smaller than the openings 46 (FIG. 1) in passivation layer 44. In accordance with some embodiments, after the development, polymer layer 48 covers the entire underlying portion of wafer 20, except the portions wherein the underlying metal pads (such as 42) are to be revealed.

After the development, another baking process, which is also a curing process, is performed to cure polymer layer 48. In accordance with some embodiments in which polymer layer 48 is formed of PBO, the baking process may be performed at a temperature in the range between about 250 degrees and about 350 degrees. The baking duration may be in the range between about 60 minutes and about 120 minutes. Through the light-exposure process and the curing process, the remaining portions of polymer layer 48 are cross-linked, and will not be patterned and removed by subsequent light-exposure and development processes.

Figure 3:
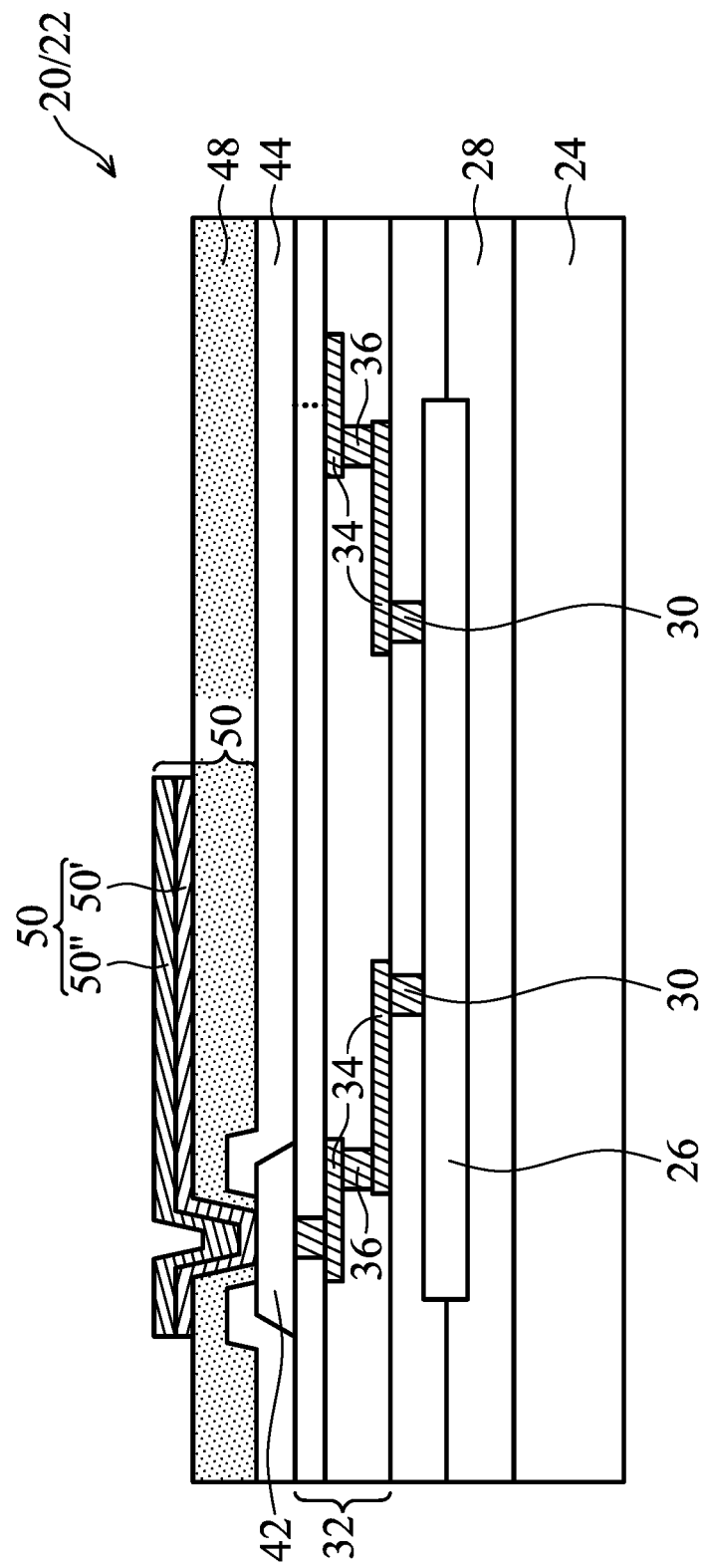

FIG. 3 illustrates the formation of conductive traces 50. Conductive traces 50 are also referred to as Redistribution Lines (RDLs) in accordance with some embodiments. The respective process is shown as process 208 in the process flow shown in FIG. 24. In accordance with some embodiments of the present disclosure, the formation of conductive traces 50 includes depositing a blanket metal seed layer, which may be a copper layer, forming a patterned plating mask (not shown) on the blanket metal seed layer, plating conductive traces 50, removing the patterned plating mask, and etching the portions of the blanket metal seed layer previously covered by the patterned plating mask. The remaining portions 50' of the metal seed layer and the plated material 50" in combination form conductive traces 50, which include via portions extending into polymer layer 48 and trace portions over polymer layer 48, as illustrated in FIG. 3.

Figure 4A:
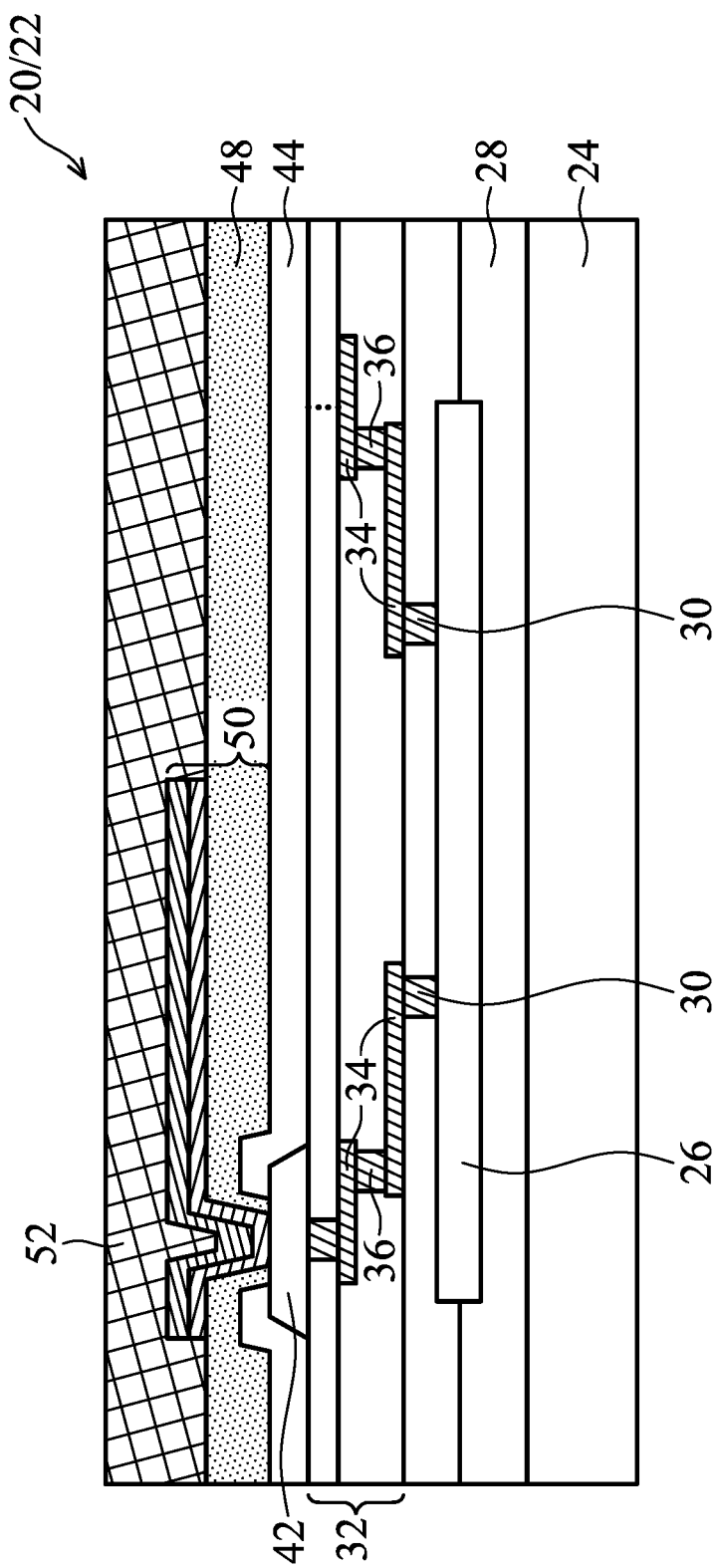

FIG. 4A illustrates the formation of top polymer layer 52. The respective process is shown as process 210 in the process flow shown in FIG. 24. The formation process may include spin-coating polymer layer 52, and then performing a pre-baking process. In accordance with some embodiments of the present disclosure, polymer layer 52 is formed of a light-sensitive polymer such as polyimide, PBO, or the like. Polymer layer 52 may be a negative photo resist or a positive resist. Furthermore, polymer layers 48 and 52 may both be negative photo resists, both be positive photo resists, or either one of polymer layers 48 and 52 is positive, and the other is negative. Polymer layer 52 may be formed of a same type of polymer (such as PBO or polyimide) as that of polymer layer 48. Alternatively, polymer layer 52 is formed of a different type of polymer than the polymer of polymer layer 48. In accordance with some embodiments in which polymer layer 48 is formed of PBO, the pre-baking may be performed at a temperature in the range between about 100 degrees and about 180 degrees. The pre-baking duration may be in the range between about 15 minutes and about 45 minutes.

Figure 4B:
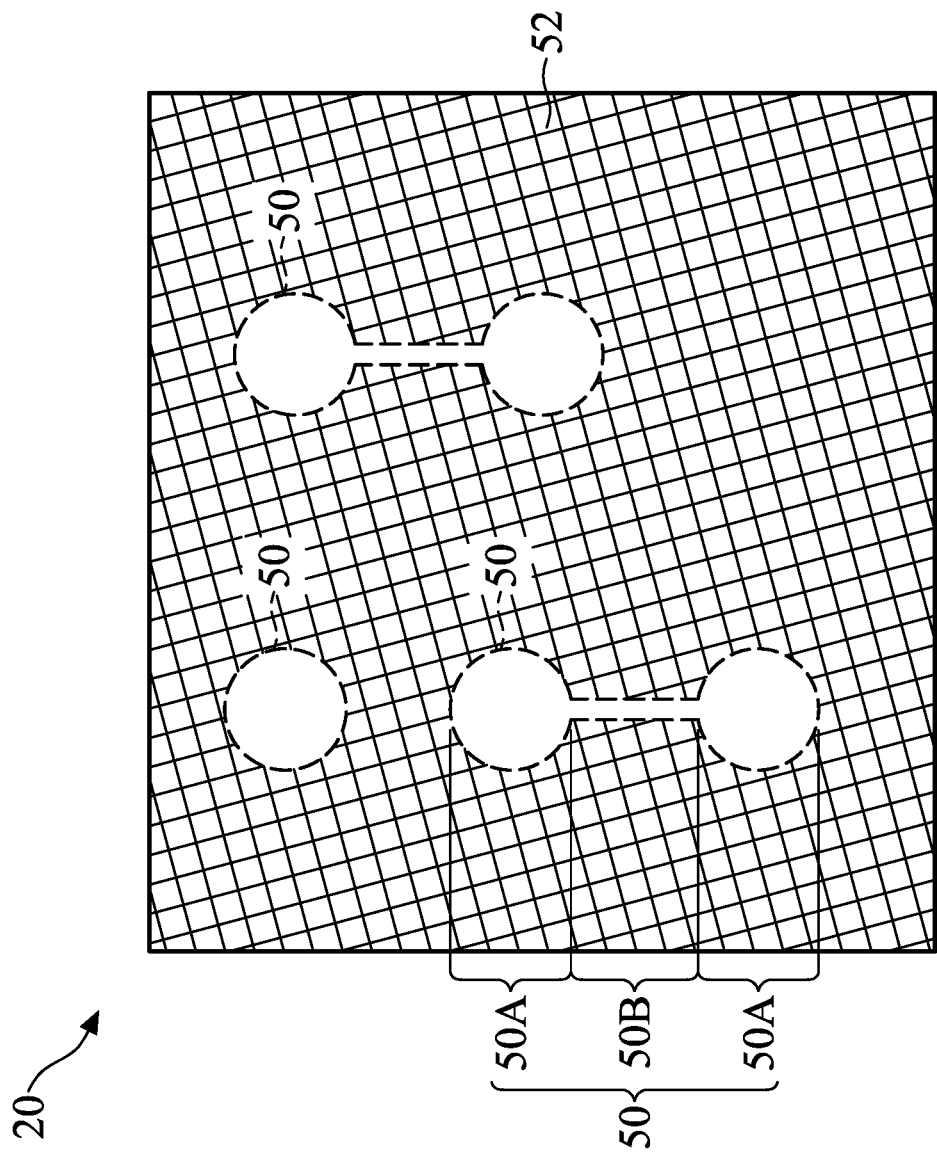

FIG. 4B illustrates the top view of a portion of wafer 20 as shown in FIG. 4A, and some portions of RDLs 50 and polymer layer 52 in accordance with some embodiments are illustrated. Since polymer layer 52 fully covers RDLs 50, RDLs 50 are illustrated using dashed lines. RDLs 50 may include (metal) pad portions 50A and trace portions 50B connected to pad portions 50A. The via portions (FIG. 4A) of RDLs 50 may be formed directly under either pad portions 50A or trace portions 50B. The via portions are not shown.

Figure 5:
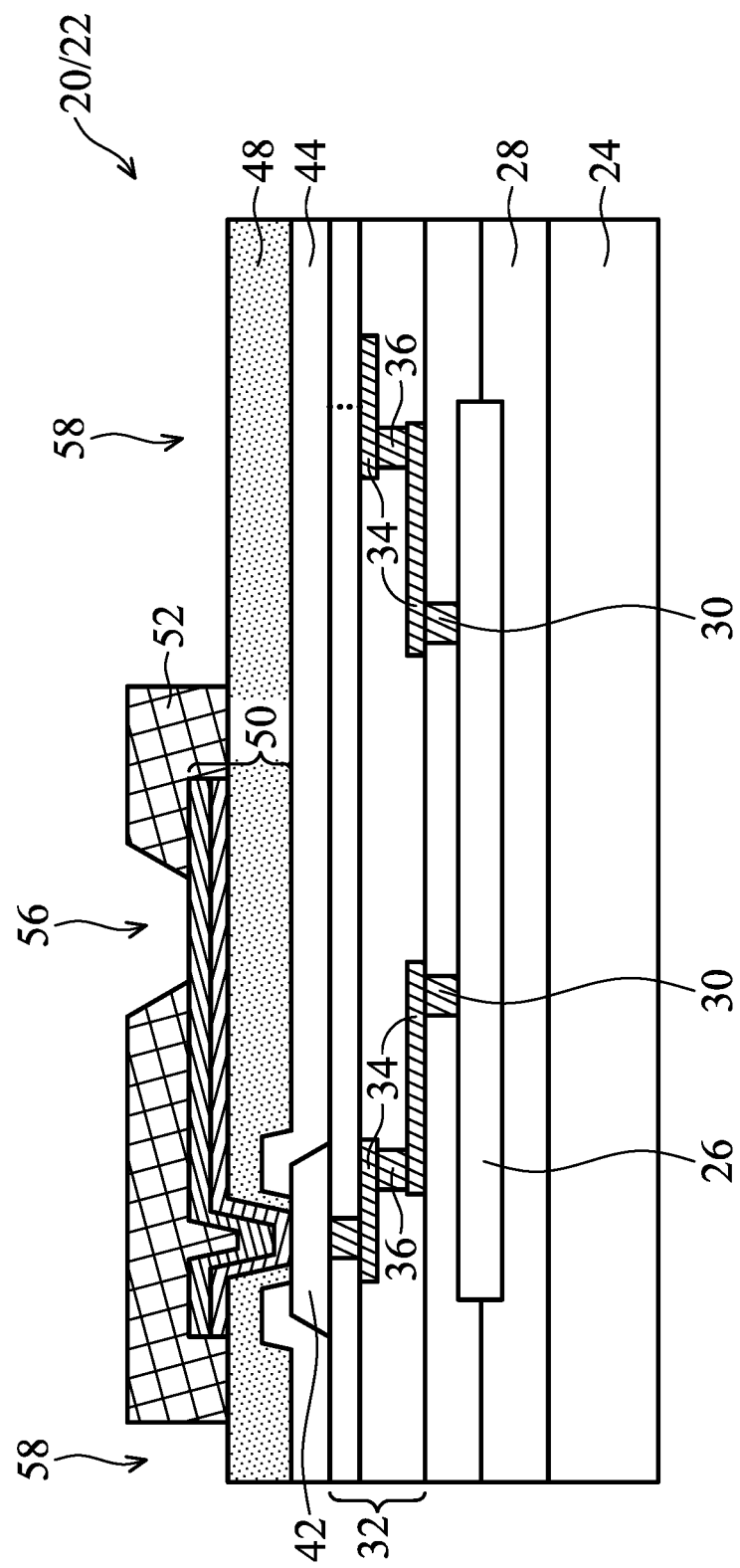

FIG. 5 illustrates the patterning of polymer layer 52 in accordance with some embodiments. The respective process is shown as process 212 in the process flow shown in FIG. 24. The patterning may include performing a light-exposure process and a development process on polymer layer 52, and performing another baking process to cure polymer layer 52. The light-exposure is performed using a lithography mask (not shown) having transparent patterns and opaque patterns, so that the patterns of openings 56 and 58 are transferred into polymer layer 52 from the lithography mask. After the light-exposure, a development process is performed, so that openings 56 are formed overlapping the underlying RDLs 50, and openings 58 are formed to reveal polymer layer 48. In the development process, the exposed polymer layer 48 will not be removed (regardless of whether polymer layers 48 and 52 are formed of a same type of material such as PBO or not) since all the remaining portions of polymer layer 48 have been cured, and have been cross-linked by the preceding processes.

After the development process, another baking process, which is also a curing process, is performed to cure polymer layer 52. In accordance with some embodiments in which polymer layer 52 is formed of PBO, the baking process may be performed at a temperature in the range between about 250 degrees and about 350 degrees. The baking duration may be in the range between about 60 minutes and about 90 minutes. Since polymer layer 48 and 52 are formed in different processes, regardless of whether polymer layers 48 and 52 are formed of different material or a same material, there may be a distinguishable interface therebetween. For example, when using Secondary Electron Microscopy (SEM) or Transmission Electron Microscopy (TEM), the interface can be distinguished.

Figure 6A:
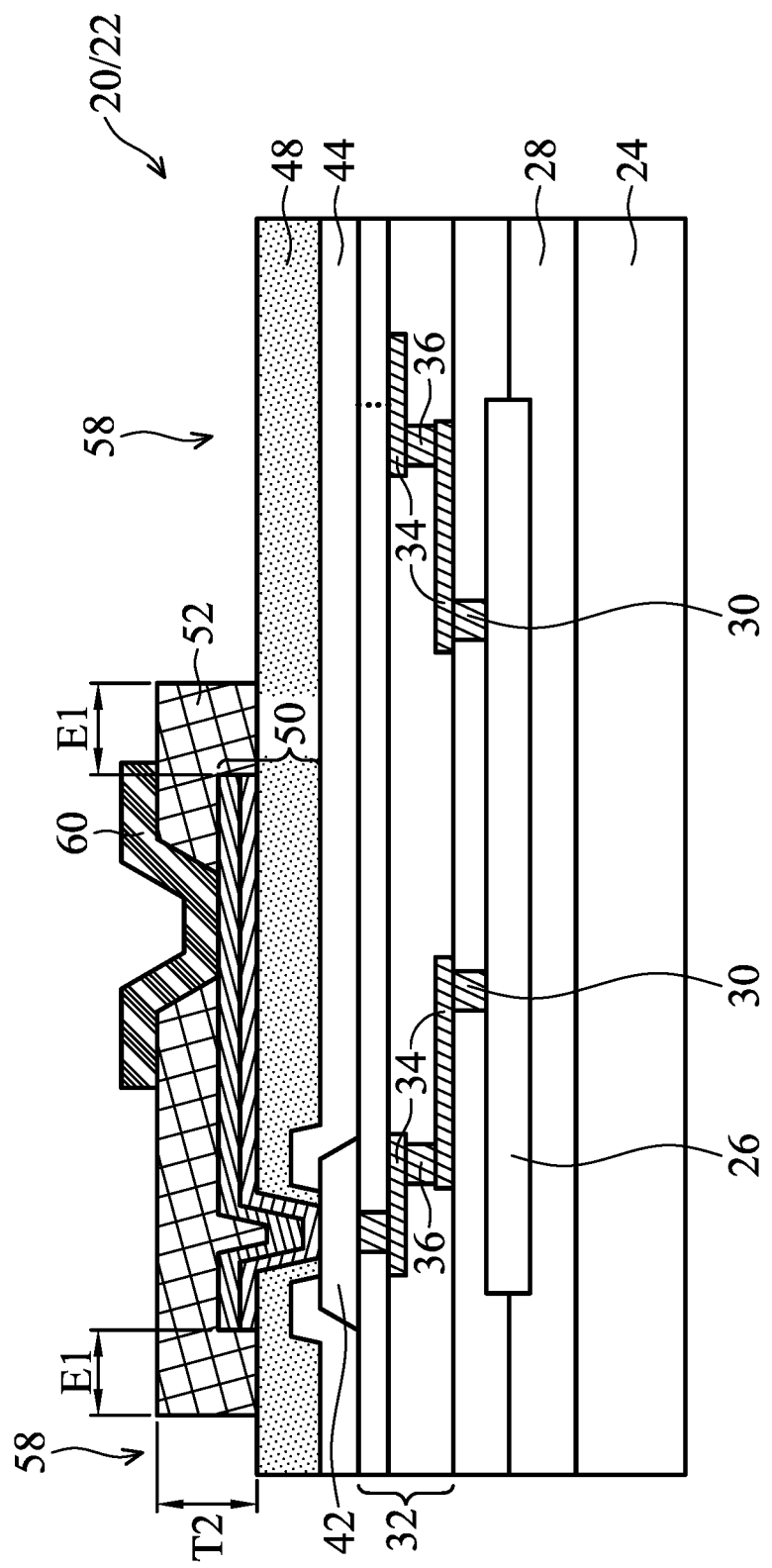

FIG. 6A illustrates the formation of Under-Bump Metallurgies (UBMs) 60. The respective process is shown as process 214 in the process flow shown in FIG. 24. In accordance with some embodiments of the present disclosure, the formation of UBMs 60 may include depositing a metal seed layer, which may include a titanium layer and a copper layer over the titanium layer, forming a patterned plating mask (not shown) on the blanket metal seed layer, plating a metallic material such as copper into the openings in the patterned plating mask, removing the patterned plating mask, and etching the portions of the metal seed layer previously covered by the patterned plating mask.

Figure 6B:
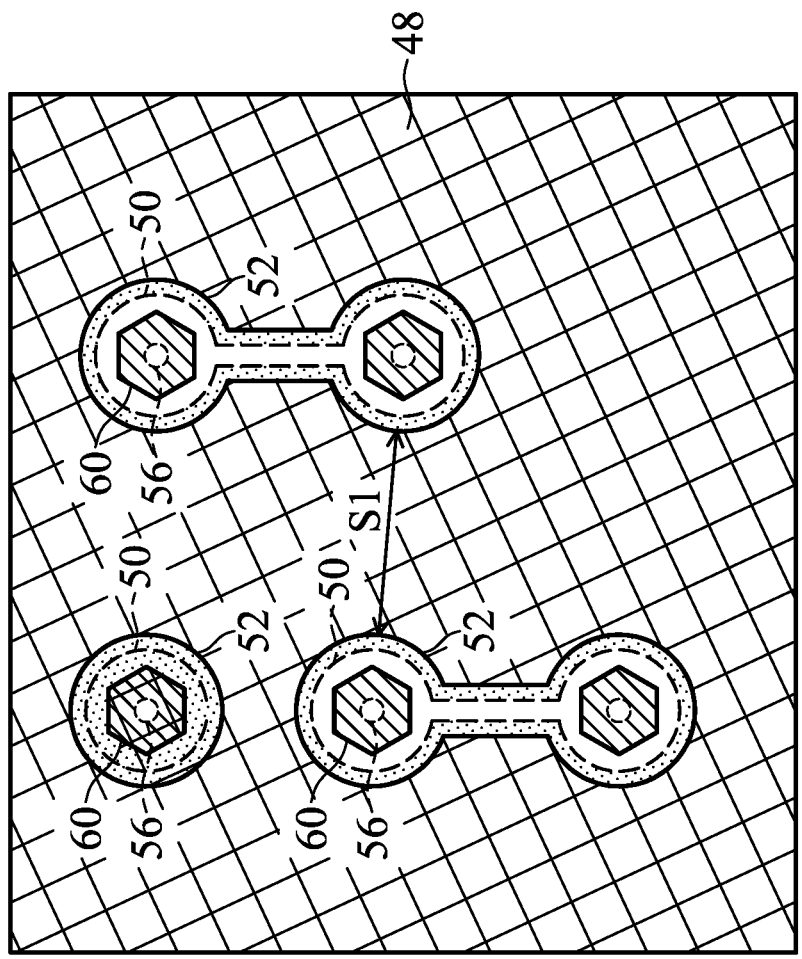
Figure 6C:
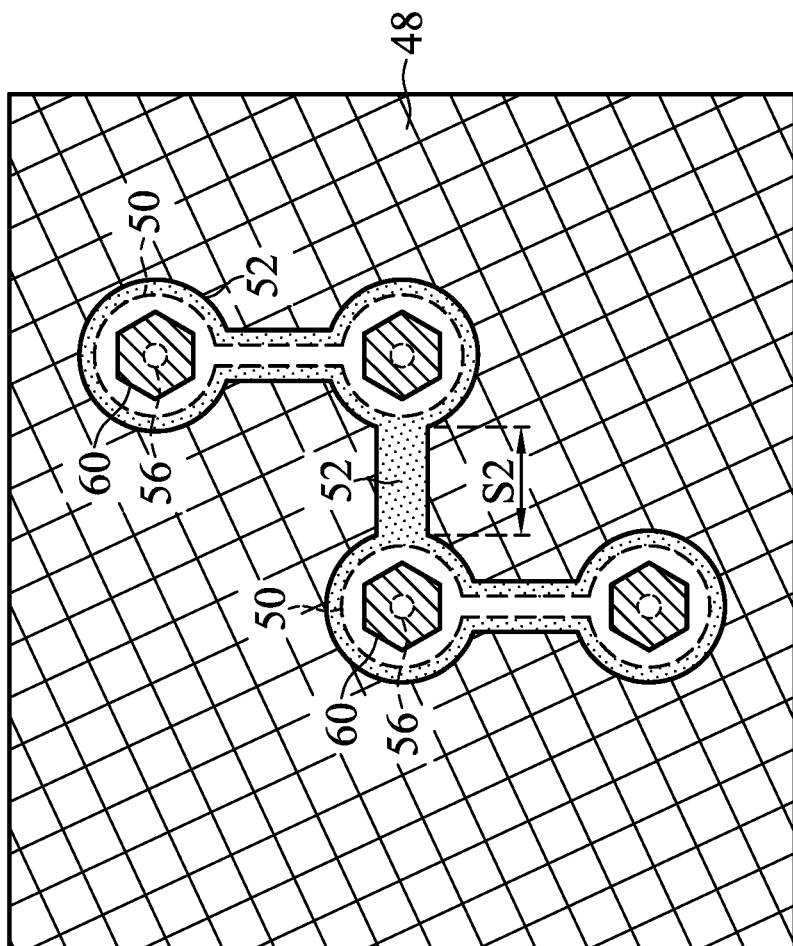

FIG. 6B illustrates a top view of a portion of wafer 20. In accordance with some embodiments of the present disclosure, the remaining portions of polymer layer 52 (referred to as polymer islands 52 hereinafter) are formed as isolated islands separated from each other. Between the islands, polymer layer 48 is exposed. In accordance with some embodiments, the design of the pattern of polymer islands 52 including determining the positions and sizes of all RDLs 50 on wafer 20 (and die 22) to ensure that polymer islands 52 cover all of RDLs 50. Furthermore, since polymer islands 52 have the function of buffering the stress applied by the overlying UBM 60, polymer islands 52 are enlarged laterally from the edges of RDLs 50, so that each of polymer islands 52 has an extension portion extending beyond the corresponding edges of the underlying RDLs 50, as illustrated in both FIGS. 6A and 6B. The extension portions are added in all directions of RDLs 50 for extension distance E1 (FIG. 6A). Extension distance E1 cannot be too large or too small. If extension distance E1 is too small, the buffering function provided by polymer islands 52 is compromised. If extension distance E1 is too large, the areas of polymer islands 52 are too large, and polymer islands 52 themselves may introduce a significant stress to the underlying passivation layer 44, resulting in passivation layer 44 to have cracks. In accordance with some embodiments, extension distance E1 is equal to or greater than thickness T2 (FIG. 6A) of polymer layer 52 to provide adequate buffering, so that the stress applied by UBM 60 is adequately absorbed. In accordance with some embodiments, there is a minimum allowed spacing S1 (FIG. 6B) between neighboring discrete polymer islands 52. The minimum allowed spacing S1 may be equal to or greater than about 10 nm. If it is found that the spacing (such as S2 in FIG. 6C) between neighboring polymer islands 52 would be smaller than the minimum spacing S1, a portion of polymer layer 52 is left to join the neighboring polymer islands 52 into a single polymer island, as illustrated in FIG. 6C. Accordingly, in wafer 20, no spacing of two neighboring polymer islands 52 that are discrete from each other is smaller than the minimum allowed spacing S1, and all neighboring polymer islands 52 with spacings smaller than the minimum allowed spacing S1 are interconnected by connecting portions of polymer layer 52.

Figure 7:
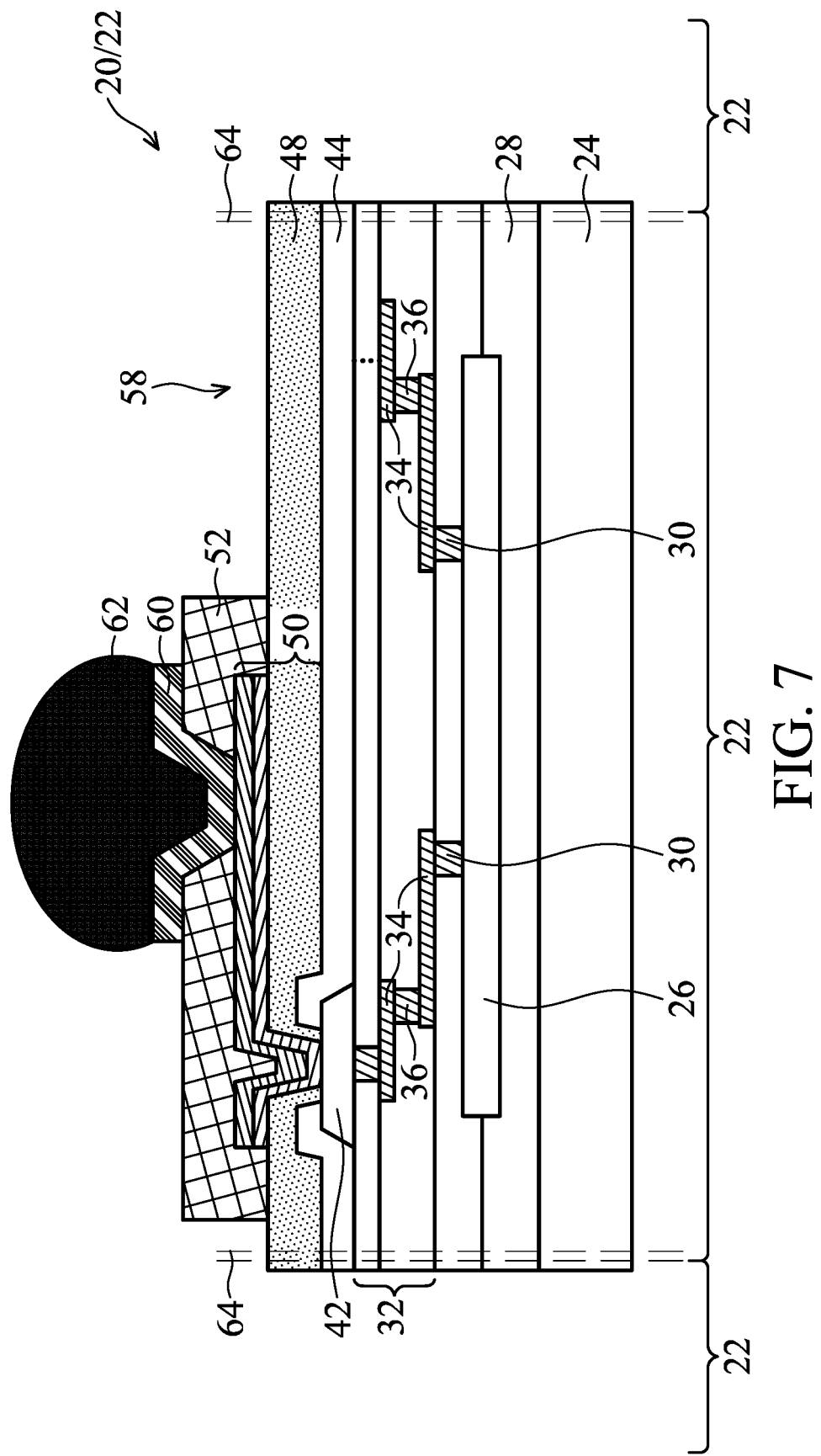
Figure 8:
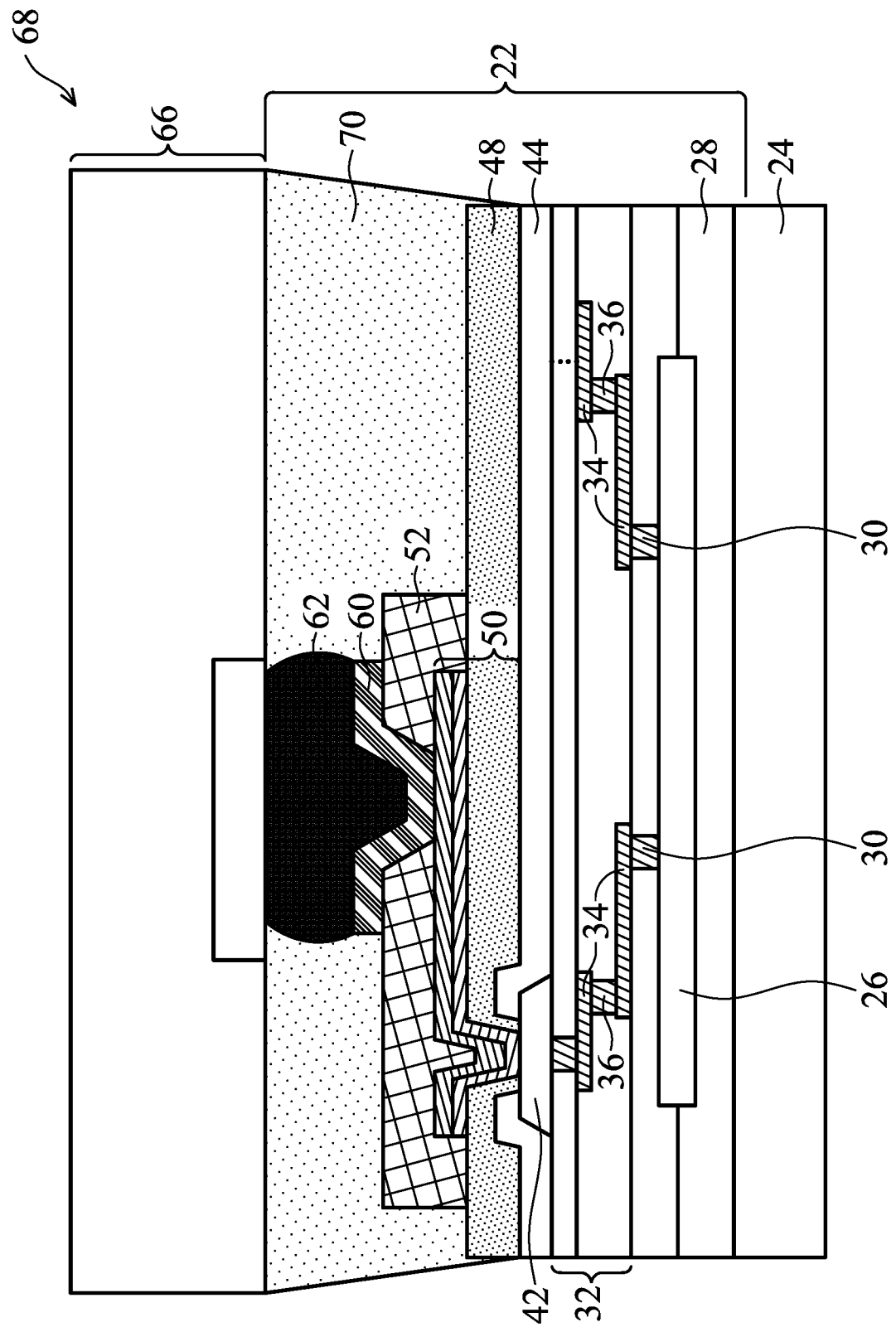

FIG. 7 illustrates the formation of solder regions 62. The respective process is shown as process 216 in the process flow shown in FIG. 24. In accordance with some embodiments of the present disclosure, the formation of solder regions 62 includes placing solder balls on UBM 60, and reflowing the solder balls. In accordance with alternative embodiments, the formation of solder regions 62 includes plating solder regions using the same plating mask that is used for plating UBM 60, and reflowing the plated solder regions after the plating mask is removed and the metal seed layer is etched.

FIG. 7 also illustrates the singulation (die-saw) of wafer 20, which is singulated along scribe lines 64. The respective process is shown as process 218 in the process flow shown in FIG. 24. Chips 22 (which are referred to as dies 22 or package components 22) are thus separated from each other, and the resulting separated chips 22 may be referred to as dies 22 also. Since polymer layer 52 has been patterned, scribe lines 64 are free from polymer layer 52. In the singulation process, the scribe lines 64 pass through polymer layer 48, and pass through the spacings between polymer islands 52. Accordingly, in the singulation process, the blade used in the singulation may not cut through any part of polymer layer 52. Also, in the resulting die 22, polymer islands 52 may be laterally spaced apart from the edges of the resulting die 22.

Next, one of dies 22 is bonded to package component 66, which may be an interposer, a package substrate, a package, a device die, a printed circuit board, or the like. The respective process is shown as process 220 in the process flow shown in FIG. 24. Underfill 70 may be disposed into the gap between die 22 and package component 66. Underfill 70 may be in contact with the top surface of polymer layer 48. Furthermore, Underfill 70 may encircle, and contact the sidewalls of, polymer islands 52, and separate polymer islands 52 from each other. Package 68 is thus formed.

Figure 9:
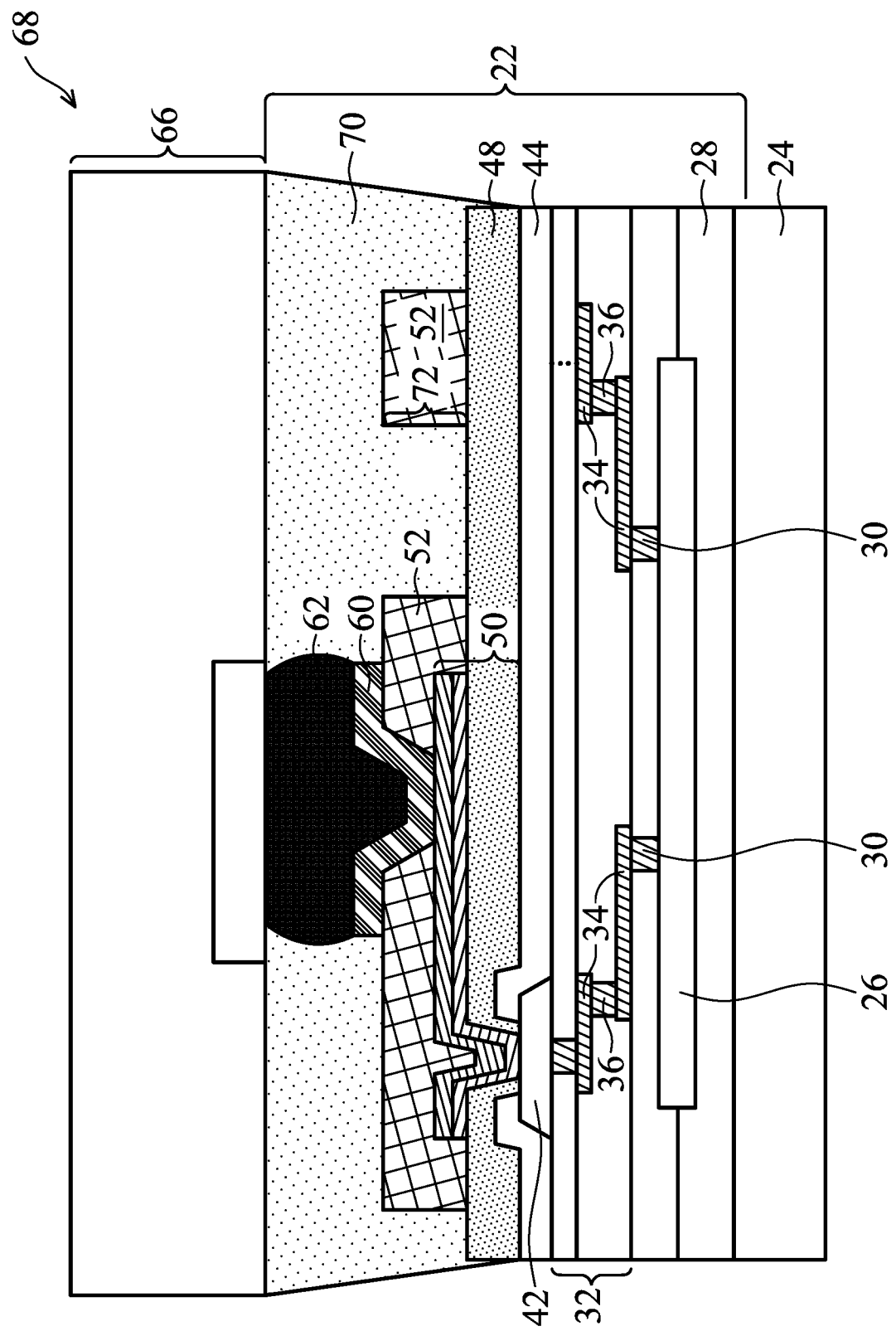
Figure 10:
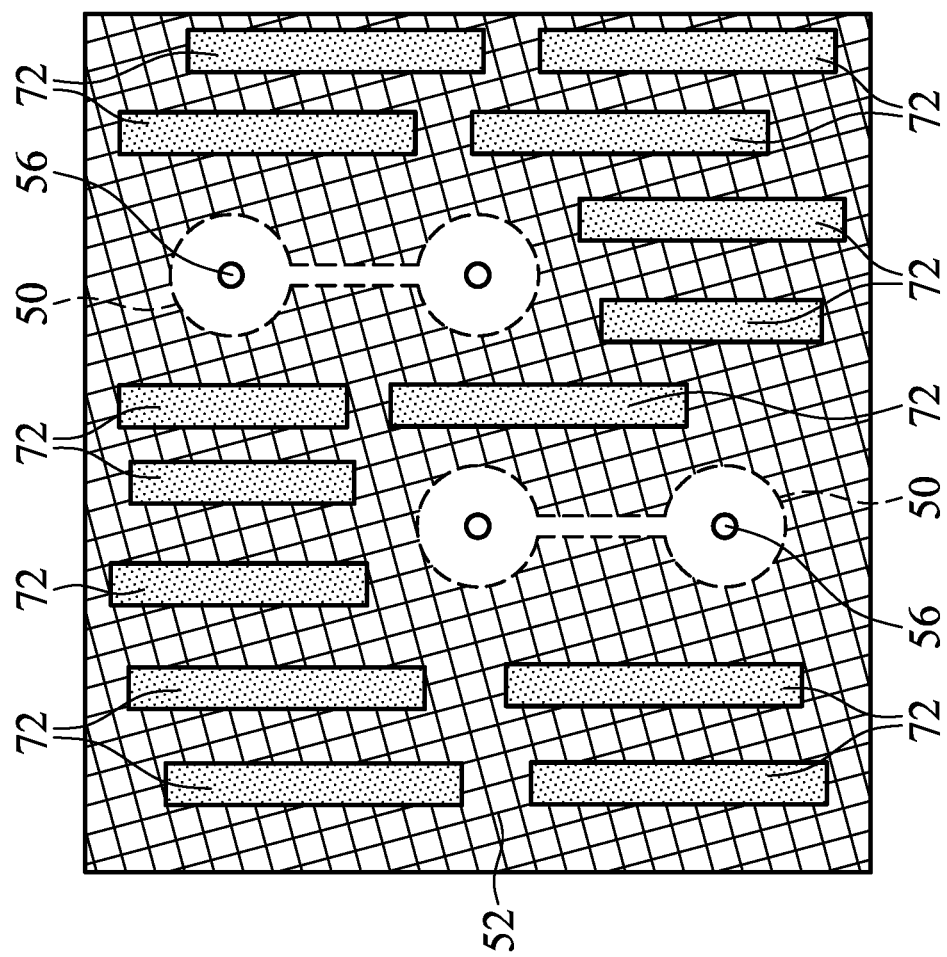
FIGS. 10 through 13 illustrate the top views of openings in top polymer layers in accordance with some embodiments.
Figure 11:
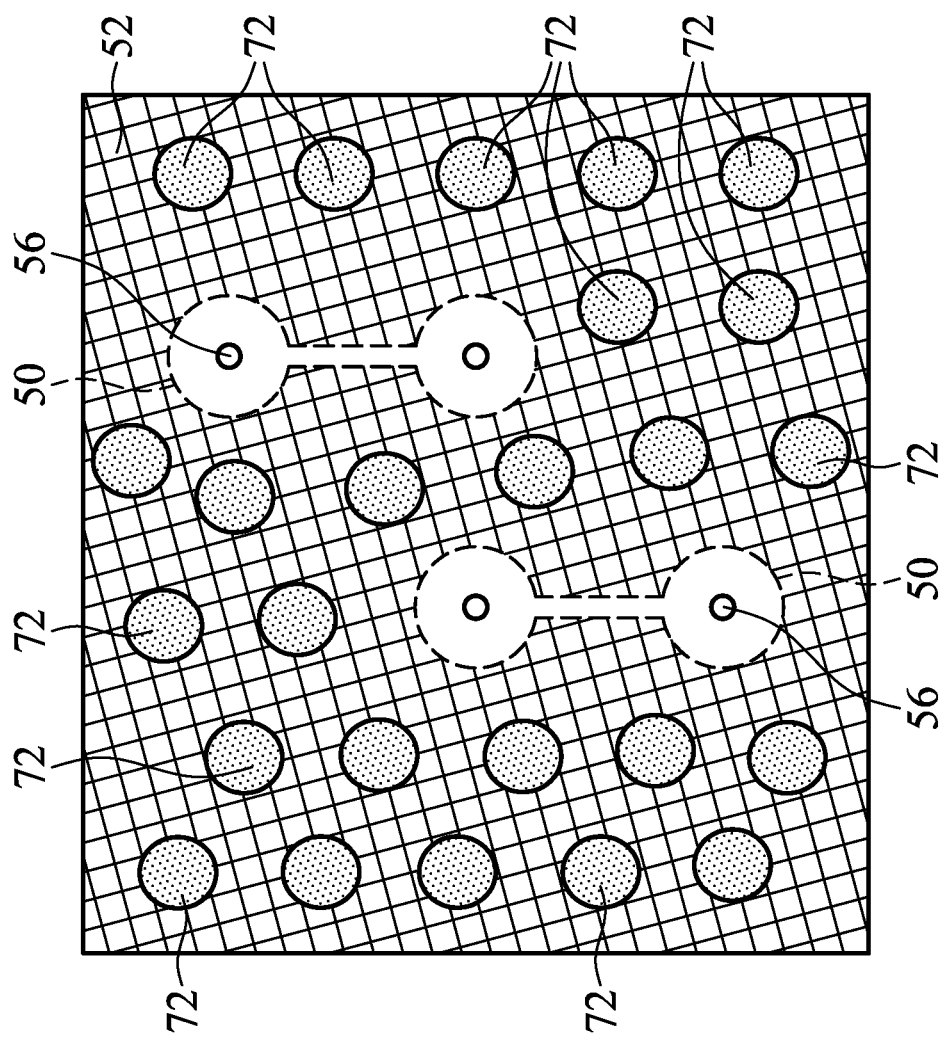
Figure 12:
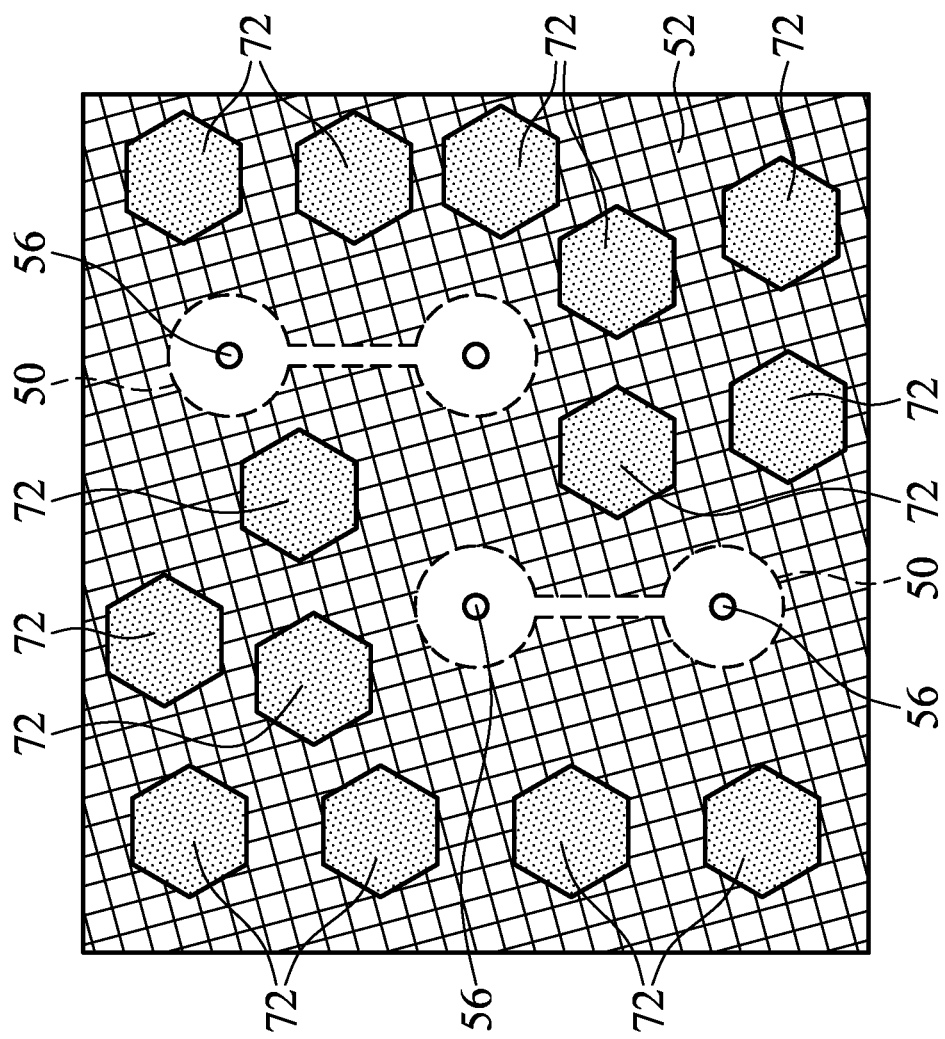
Figure 13:
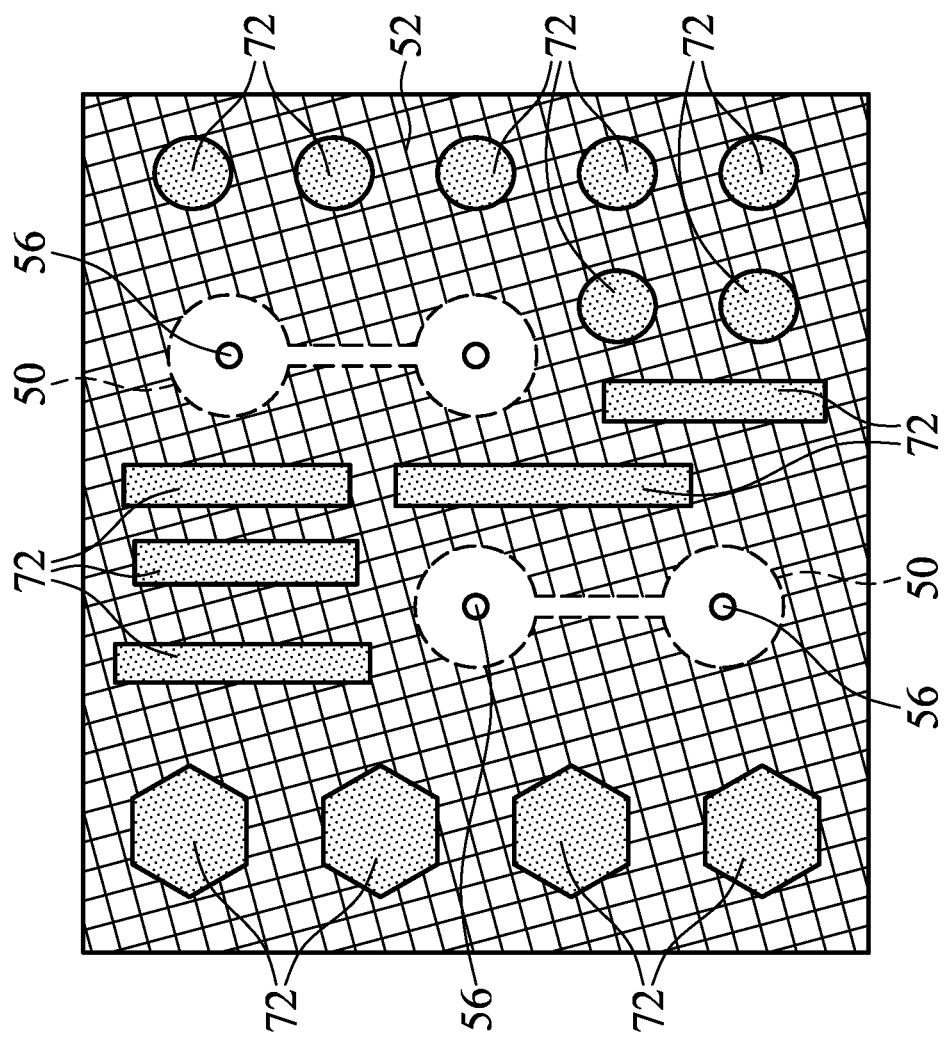

FIG. 9 illustrates package 68 in accordance with some embodiments. These embodiments are similar to the embodiments in FIG. 8, except that openings 72 are formed in polymer layer 52, with opening 72 being discrete openings isolated from each other by a continuous polymer layer 52. Underfill 70 extends into the openings 72, and will be in contact with polymer layer 48. The top views of some portions of the respective die 22 (and wafer 20) are illustrated in FIGS. 10 through 13, which have different patterns of openings 72. For example, FIG. 10 illustrates that openings 72 are strips. FIG. 11 illustrates that openings 72 are circles. FIG. 12 illustrates that openings 72 may be polygons such as squares, rectangles, hexagons, octagons, or the like. Openings 72 may also have mixed patterns. For example, FIG. 13 illustrates that some openings 72 have polygonal shapes, while other openings 72 have circular shapes, strip shapes, or the like. The locations of openings 72 are selected so that none of RDLs 50 are exposed through any opening 72.

In accordance with some embodiments, in the formation of openings 72, polymer layer 52 is removed from scribe lines 64 (FIG. 7), and scribe lines 64 are free from polymer layer 52 therein. In the singulation process, the cutting blade cuts through polymer layer 48, and passes through the spacings between the remaining portions of polymer layer 52, without cutting into polymer layer 52. The remaining portions of polymer layer 52 may form an integrated piece (with openings 72 therein) in each of dies 22, with scribe lines free from polymer layer 52. Alternatively, in scribe lines 64, there are some portions of polymer layer 52 left, and discrete openings 72 are also formed in scribe lines 64. Accordingly, in the die singulation process, polymer layer 52 is also cut into.

In the embodiments as shown in FIGS. 6B, 6C, and 11 through 13, the total area of RDLs 50 in a die 22 is denoted as A ($\mu m^2$). The total area of die 22 is denoted as B ($\mu m^2$). Accordingly, the density C of RDLs 50 is B/A, which is represented as a percentage. Since polymer layer 52 covers all of RDLs 50 and additional areas, the polymer density D (a percentage) of polymer layer 52, which is the total area of polymer layer 52 in die 22 divided by the total area of die 22, is greater than RDL density C. In accordance with some embodiments of the present disclosure, polymer density D is greater than RDL density C by a different (D-C), which is greater than about 5 percent. Difference (D-C) may be in the range between about 5 percent and about ten percent. If E is used to represent the density of the area free from polymer layer 52, then E is equal to (100%-D), which may be in the range between about (90%-C) and about (95%-C). Density E is referred to as polymer-open ratio E hereinafter. Polymer-open ratio E cannot be too large or too small. If polymer-open ratio E is too large, for example, greater than about 70 percent, the remaining portions of polymer layer 52 may be too small, and cannot provide enough buffering. If polymer-open ratio E is too small, for example, smaller than about 10 percent, the stress resulted from polymer 52 may cause the underlying passivation layer 44 to crack. In accordance with some embodiments, polymer-open ratio E is in the range between about 10 percent and about 70 percent.

Figure 14:
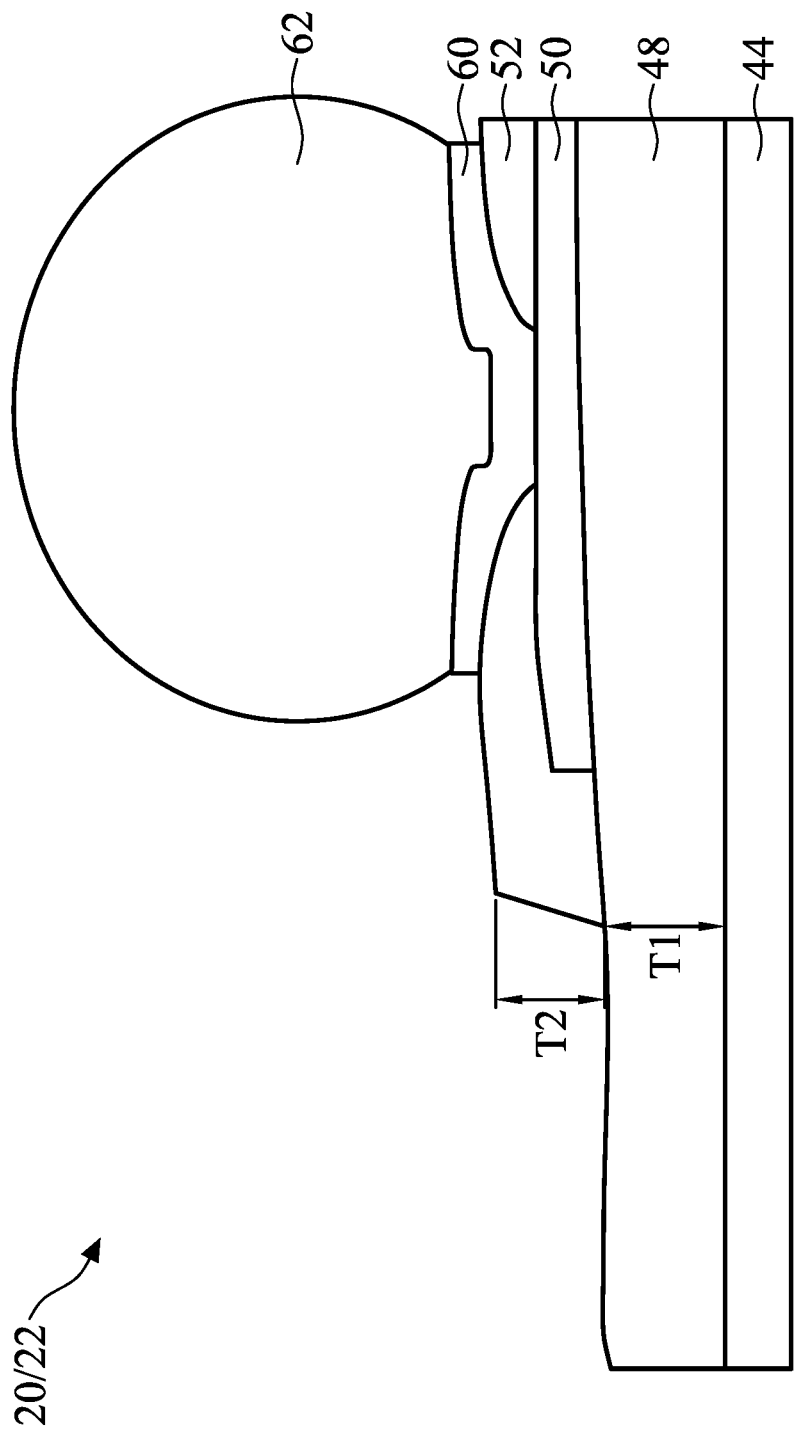
FIG. 14 illustrates a cross-sectional view of a part of a package in accordance with some embodiments.

FIG. 14 illustrates a portion of die 22 (wafer 20) in accordance with some embodiments, wherein some details of the profiles of some features are shown. In accordance with some embodiments, polymer layer 48 has thickness T1, which may be smaller than about 12 µm, and may be in the range between about 5 µm and about 12 µm. Thickness T2 of polymer layer 52 may be greater than, equal to, or smaller than, thickness T1.

The embodiments of the present disclosure are also applicable to other package components other than wafers and device dies. For example, FIGS. 15 through 23 illustrate the cross-sectional views of intermediate stages in the formation of a package including a device die encapsulated in an encapsulant in accordance with some embodiments of the present disclosure. Unless specified otherwise, the materials and the formation methods of the components in these embodiments are essentially the same as the like components, which are denoted by like reference numerals in the embodiments shown in FIGS. 1 through 9. The details regarding the formation processes and the materials of the components shown in FIGS. 15 through 23 may thus be found in the discussion of the embodiments shown in FIGS. 1 through 9.

Figure 15:
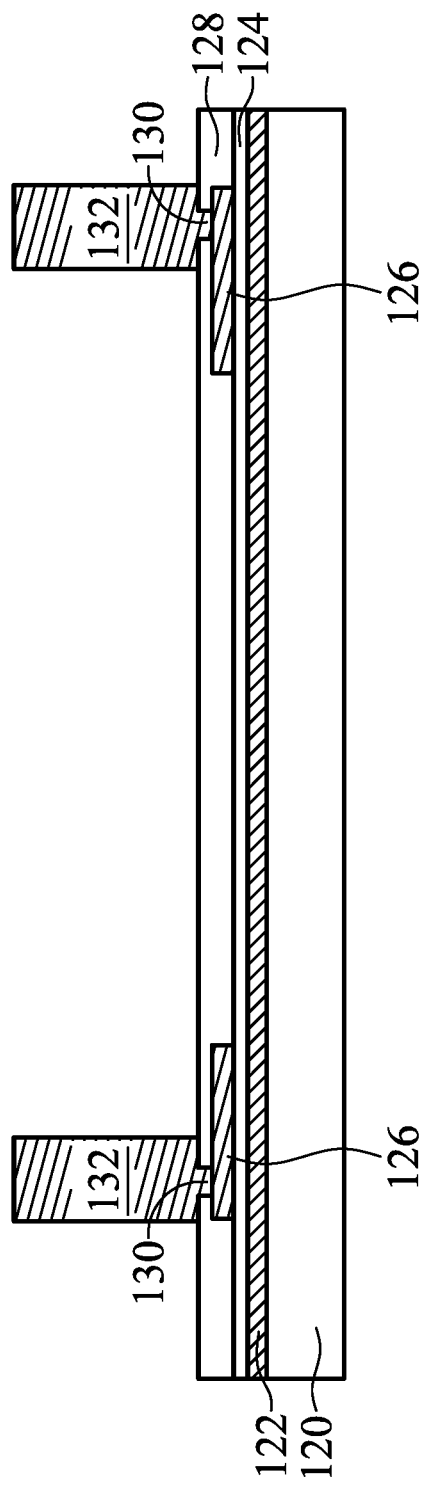
FIGS. 15 through 23 illustrate the cross-sectional views of intermediate stages in the formation of a package including an encapsulated device die and through-vias in accordance with some embodiments.

FIG. 15 illustrates the formation of an initial structure, which includes carrier 120, release film 122, dielectric layer 124, RDLs 126, dielectric layer 128, and metal posts 132. Carrier 120 may be a glass carrier, a ceramic carrier, or the like. Release film 122 may be formed of a polymer-based material (such as a Light-To-Heat-Conversion (LTHC) material). Dielectric layer 124 is formed on release film 122. In accordance with some embodiments of the present disclosure, dielectric layer 124 is formed of a polymer, which may also be a photo-sensitive material such as PBO, polyimide, or the like. In accordance with alternative embodiments, dielectric layer 124 is formed of a nitride such as silicon nitride, an oxide such as silicon oxide, PSG, BSG, BPSG, or the like. RDLs 126 are formed over dielectric layer 124. The formation processes and the materials of RDLs 126 may be similar to the processes and the materials of RDLs 50 (FIG. 4A).

Further referring to FIG. 15, dielectric layer 128 is formed on RDLs 126. The bottom surface of dielectric layer 128 is in contact with the top surfaces of RDLs 126 and dielectric layer 124. Dielectric layer 128 may be formed of a material selected from the same group of candidate materials for forming dielectric layer 124. Dielectric layer 128 is then patterned to form openings (filled by vias 130) therein to expose RDLs 126.

Metal posts 132 and vias 130 are formed. Throughout the description, metal posts 132 are alternatively referred to as through-vias 132 since metal posts 132 penetrate through the subsequently formed encapsulant. In accordance with some embodiments of the present disclosure, through-vias 132 are formed by plating. The plating of through-vias 132 may include forming a blanket seed layer (not shown) over dielectric layer 128 and extending into the openings in dielectric layer 128, forming and patterning a plating mask (not shown), and plating through-vias 132 on the portions of the seed layer that are exposed through the openings in the photo resist. The photo resist and the portions of the seed layer that were covered by the photo resist are then removed. The material of through-vias 132 and vias 130 may include copper, aluminum, titanium, or the like, or multi-layers thereof.

Figure 16:
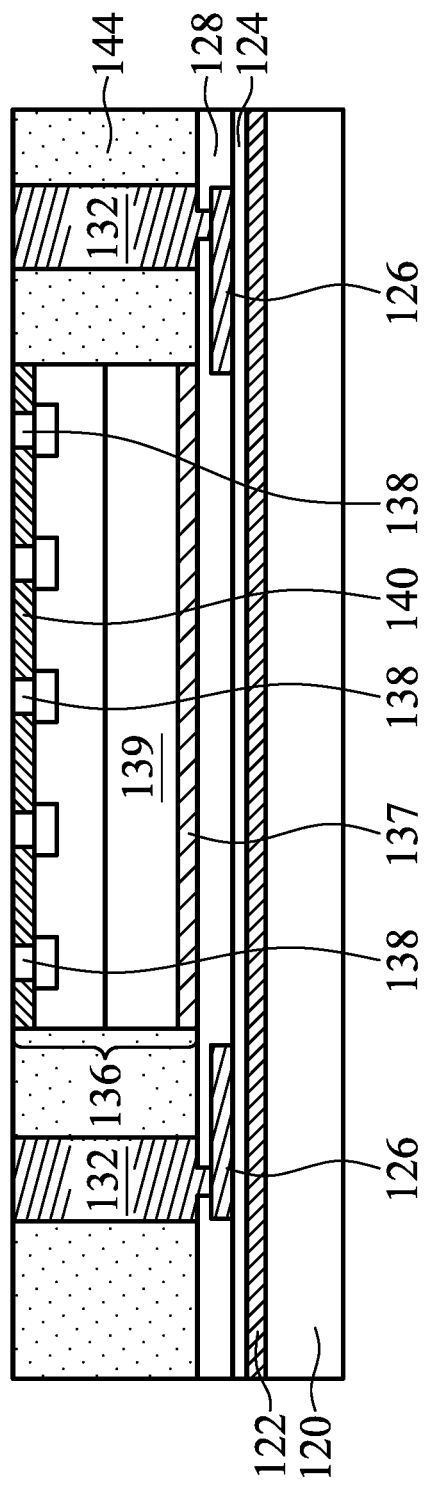

FIG. 16 illustrates the placement of device die 136. Device die 136 is adhered to dielectric layer 128 through Die-Attach Films (DAF) 137, which may be an adhesive film. DAF 137 may be in contact with the back surface of the semiconductor substrate 139 in device die 136. Device die 136 may be a logic device die including logic transistors therein. In accordance with some embodiments, metal pillars 138 (such as copper posts) are pre-formed as the topmost portions of device die 136, wherein metal pillars 138 are electrically coupled to the integrated circuit devices such as transistors in device die 136. In accordance with some embodiments of the present disclosure, a polymer fills the gaps between neighboring metal pillars 138 to form top dielectric layer 140. The top dielectric layer 140 (which is also referred to as polymer layer 140) may be formed of PBO, polyimide, or the like in accordance with some embodiments.

Next, encapsulant 144 is encapsulated on device die 136. Encapsulant 144 fills the gaps between neighboring through-vias 132 and the gaps between through-vias 132 and device die 136. Encapsulant 144 may include a molding compound, a molding underfill, an epoxy, a resin, or the like. The top surface of encapsulant 144 is higher than the top ends of metal pillars 138.

Further referring to FIG. 16, a planarization process such as a CMP process or a mechanical grinding process is performed to thin encapsulant 144, until through-vias 132 and metal pillars 138 are exposed. Due to the grinding, the top ends of through-vias 132 are substantially level (coplanar) with the top surfaces of metal pillars 138, and are substantially coplanar with the top surface of encapsulant 144.

Figure 17:
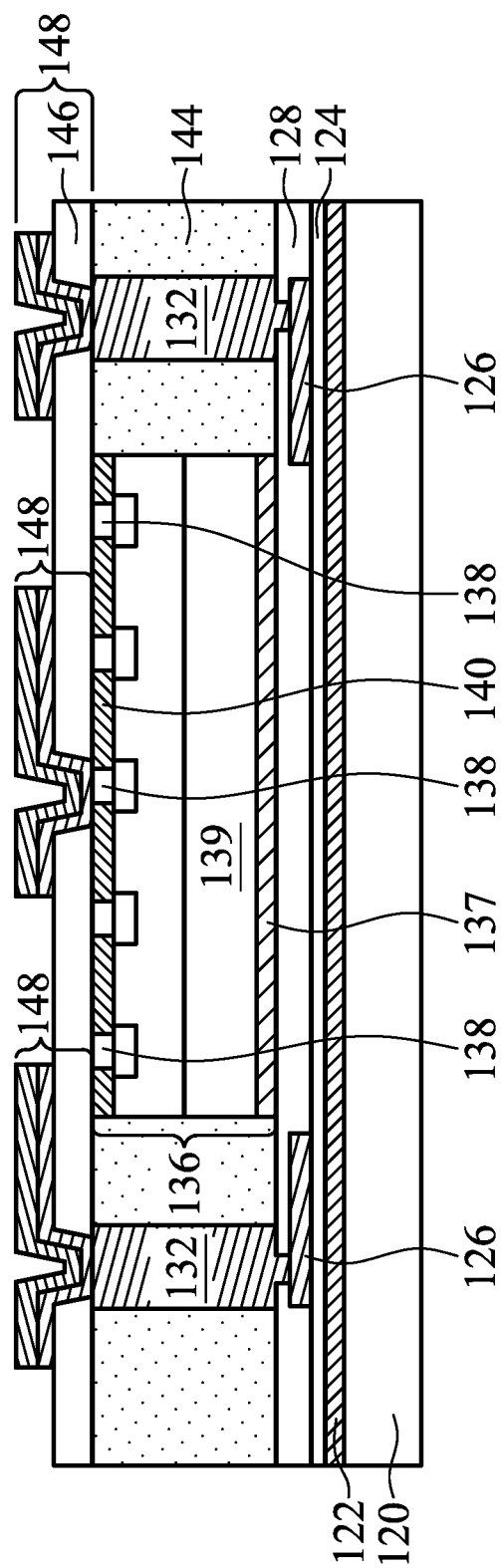

Referring to FIG. 17, dielectric layer 146 is formed. In accordance with some embodiments of the present disclosure, dielectric layer 146 is formed of a polymer, which may also be a photo-sensitive dielectric material in accordance with some embodiments of the present disclosure. For example, dielectric layer 146 may be formed of PBO, polyimide, or the like. In accordance with alternative embodiments, dielectric layer 146 is formed of an inorganic material such as silicon nitride, silicon oxide, or the like. Dielectric layer 146 is patterned in a photo lithography process, so that openings (filled by RDLs 148) are formed.

Next, RDLs 148 are formed to connect to metal pillars 138 and through-vias 132. RDLs 148 may also interconnect metal pillars 138 and through-vias 132. RDLs 148 include metal traces (metal lines) over dielectric layer 146 as well as vias extending into dielectric layer 146 to electrically connect to through-vias 132 and metal pillars 138. The forming method, the material, and the forming processes of RDLs 148 may be essentially the same as that of RDLs 50 in FIG. 3, and hence are not repeated herein.

Figure 18:
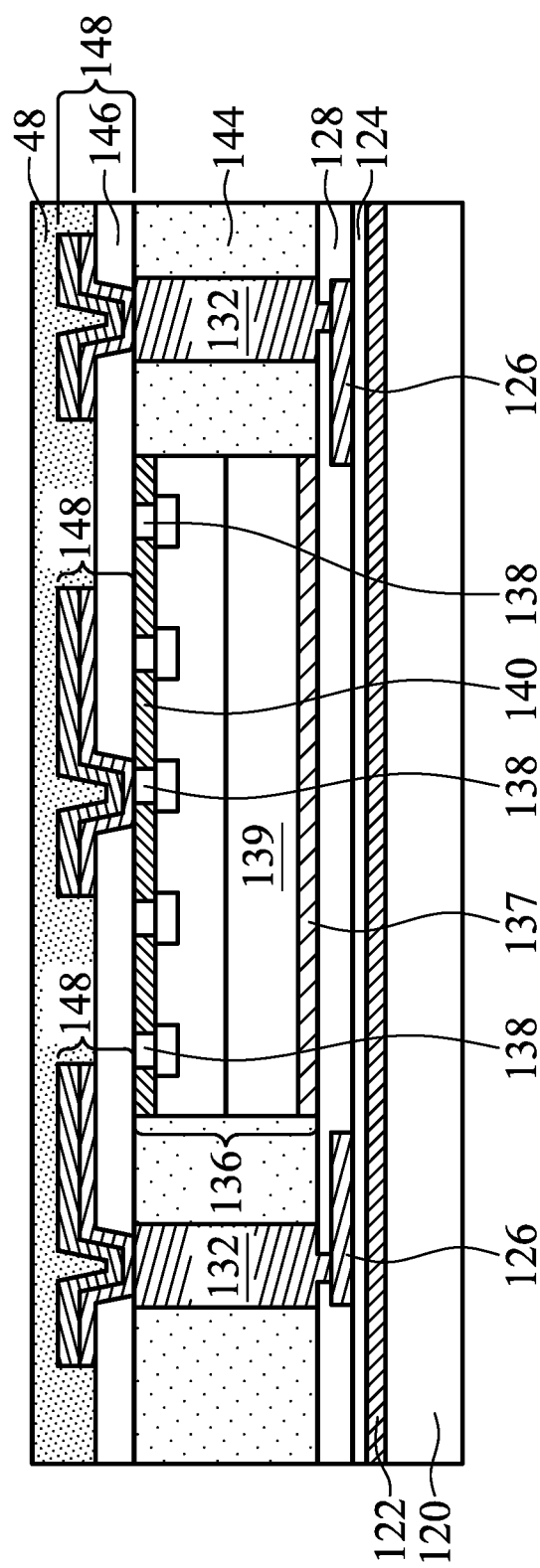
Figure 19:
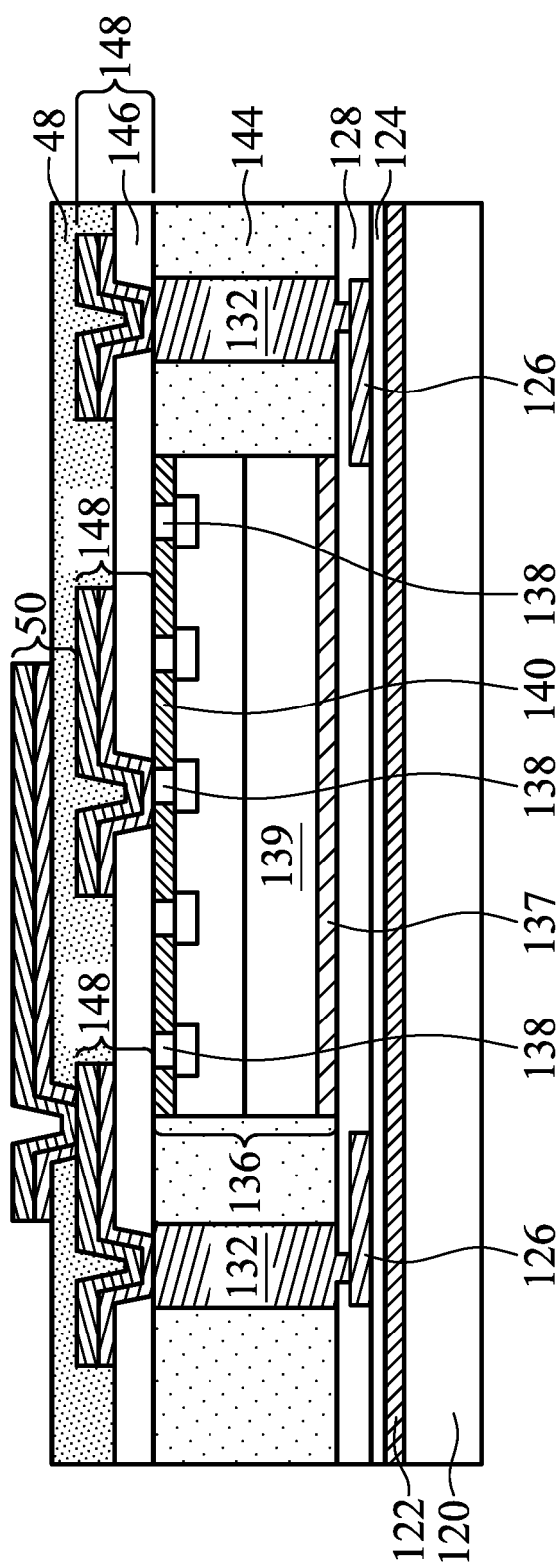
Figure 20:
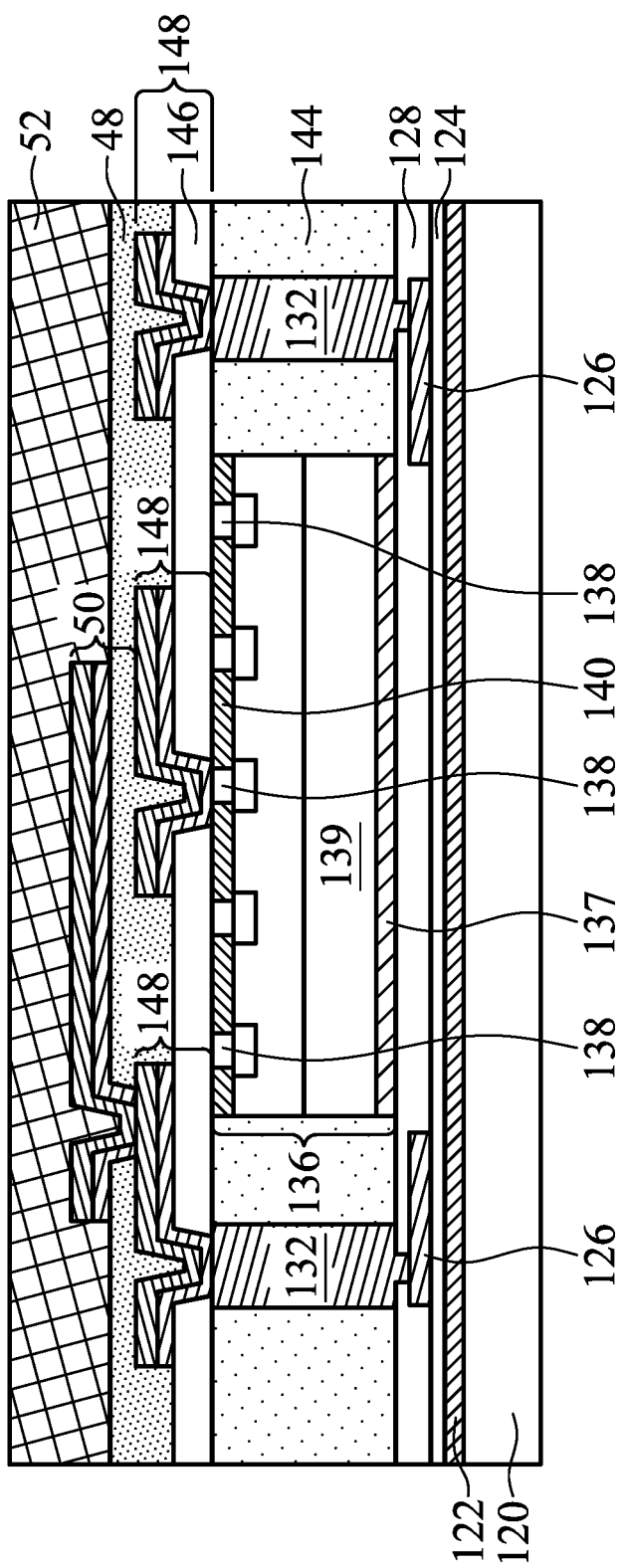
Figure 21:
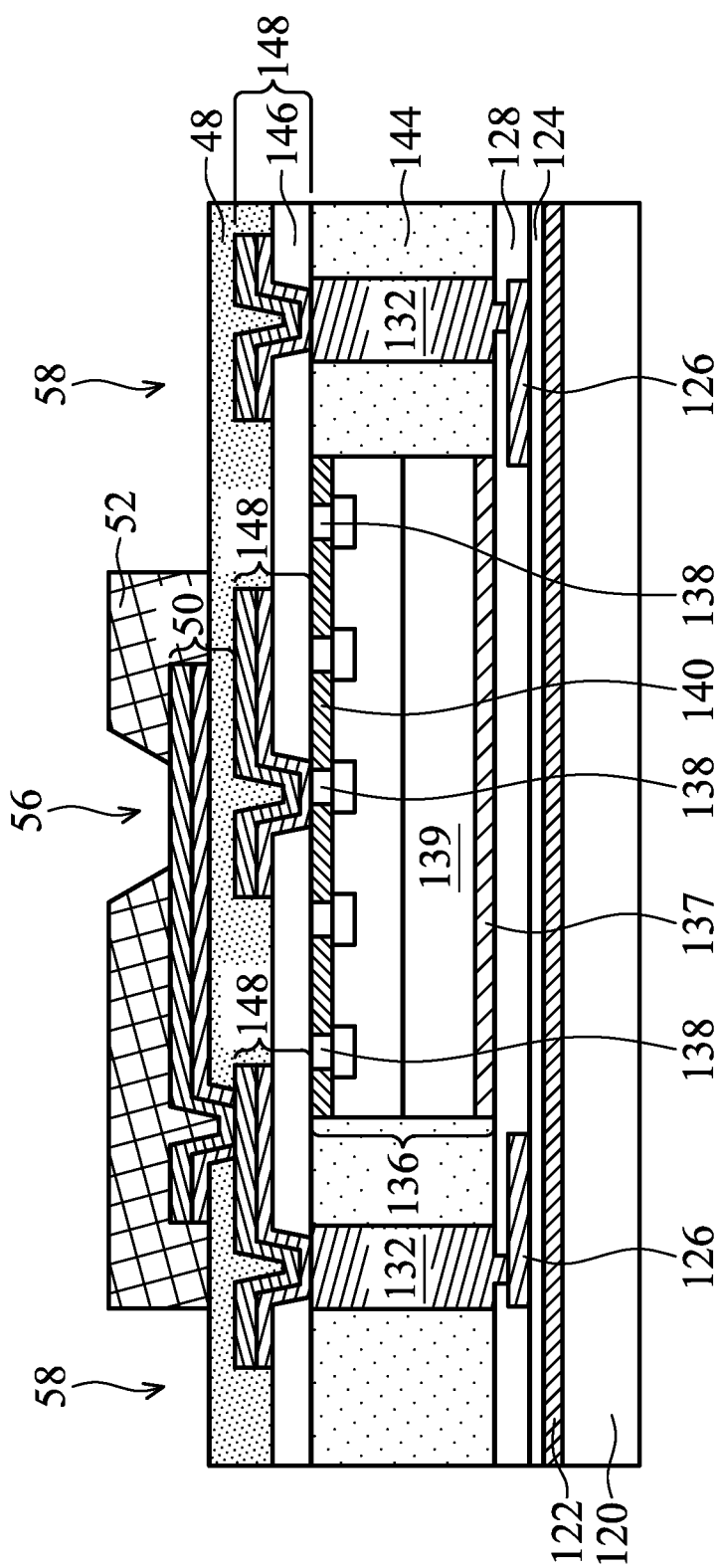
Figure 22:
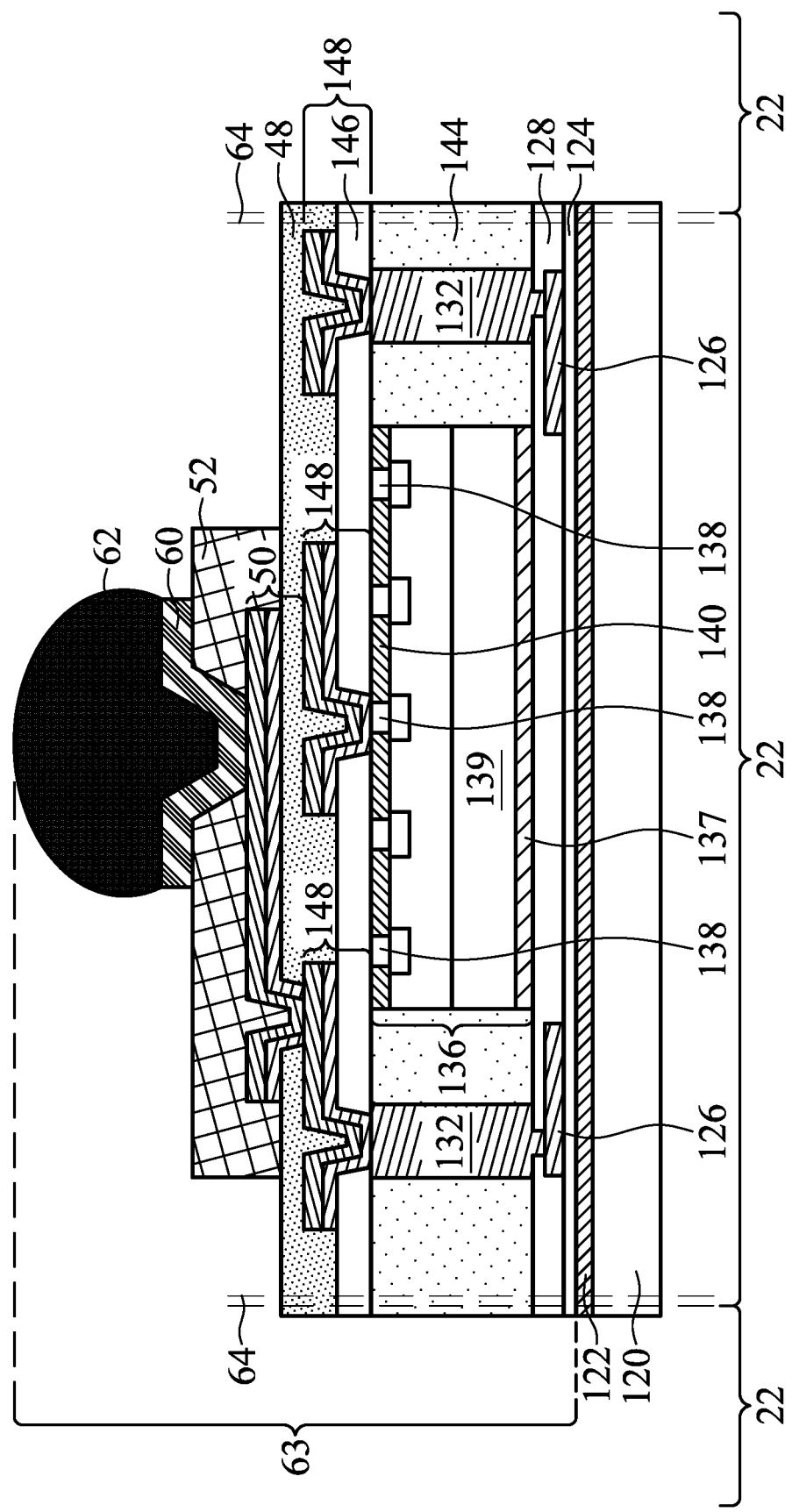
Figure 23:
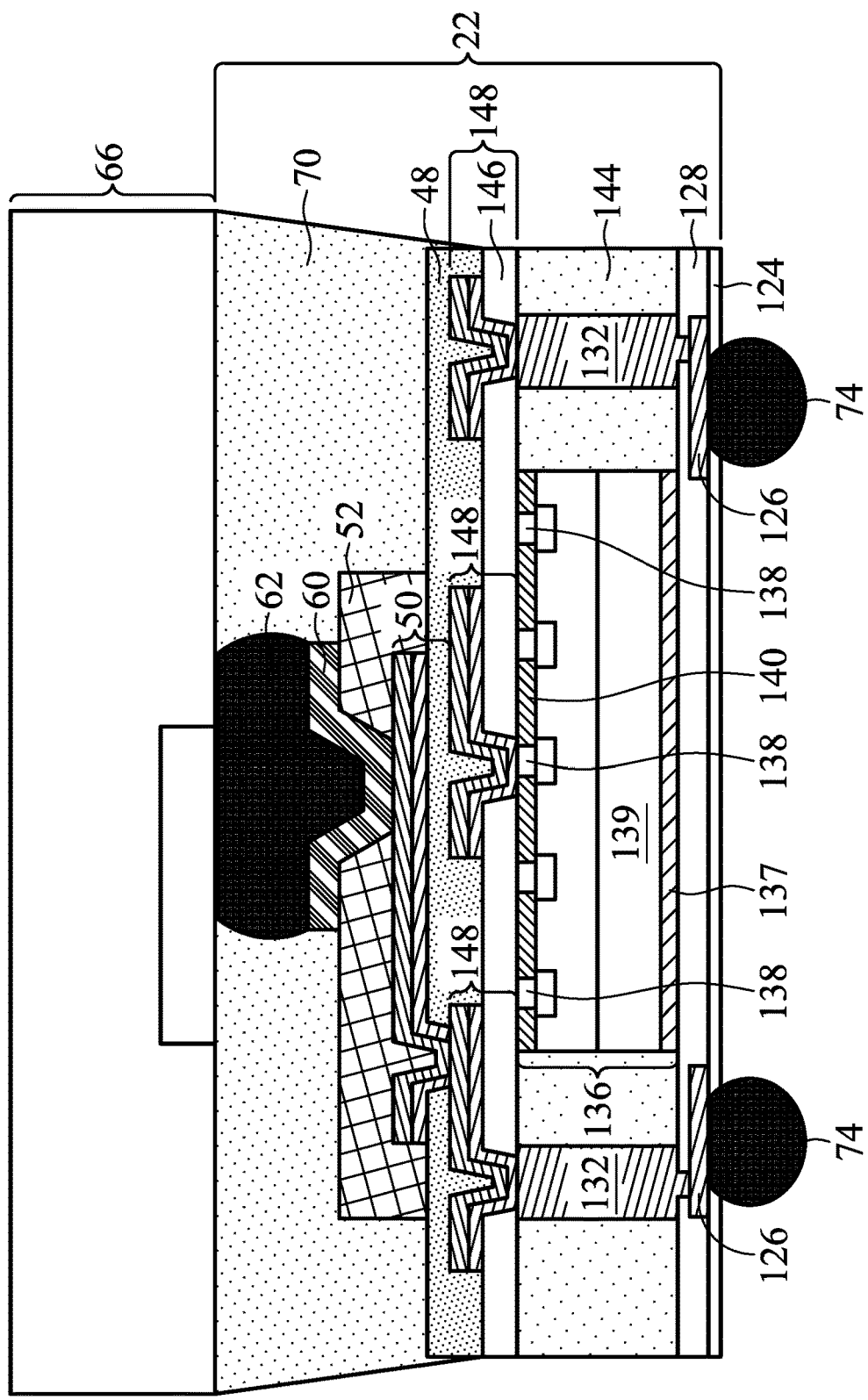

In subsequent processes as shown in FIGS. 18 through 22, more dielectric layers and RDLs and the overlying UBMs and solder regions are formed. The formation processes are similar to the processes as shown in FIGS. 3 through 7, and thus are not discussed in detail herein. The details may be found by referring to the discussion referring to FIGS. 3 through 7. FIG. 18 illustrates the formation of polymer layer 48. FIG. 19 illustrates the formation of RDLs 50, followed by the formation of polymer layer 52 as in FIG. 20. FIG. 21 illustrates the patterning of polymer layer 52 to form openings 56 and 58, through which RDLs 50 and polymer layer 48 are exposed. FIG. 22 illustrates the formation of UBM 60 and solder region 62. The resulting reconstructed wafer 63 is then demounted from carrier 120, and solder regions 74 are formed. The reconstructed wafer 63 is then sawed along scribe lines 64 to form individual package components 22. FIG. 23 illustrates the bonding of package component 22 onto package component 66 to form package 68, with underfill 70 filled between package components 22 and 66.

It is appreciated that the embodiments as discussed referring to FIGS. 6B, 6C, and 10 through 14 also apply to the embodiments as shown in FIG. 23. Also, the discussions of the areas, ratios, thicknesses, etc. of polymer layers 48 and 52, RDLs 50, and UBM 60 also apply to the embodiments in FIG. 23.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By patterning the top polymer layer to form polymer islands or forming openings in the top polymer layer, the stress applied by the top polymer layer on the underlying dielectric layer is reduced, and the likelihood of cracking the underlying dielectric layer is reduced.

In accordance with some embodiments of the present disclosure, a method of forming a semiconductor device comprises forming a plurality of metal pads over a semiconductor substrate of a wafer; forming a passivation layer covering the plurality of metal pads; patterning the passivation layer to reveal the plurality of metal pads; forming a first polymer layer over the passivation layer; forming a plurality of redistribution lines extending into the first polymer layer and the passivation layer to connect to the plurality of metal pads; forming a second polymer layer over the first polymer layer; and patterning the second polymer layer to reveal the plurality of redistribution lines, wherein the first polymer layer is further revealed through openings in remaining portions of the second polymer layer. In an embodiment, the second polymer layer is patterned into a plurality of discrete islands spaced apart from each other, and the first polymer layer is revealed through spacings between the plurality of discrete islands. In an embodiment, in the patterning the second polymer layer, a plurality of openings are formed in the second polymer layer to reveal underneath portions of the first polymer layer, and edges of each of the openings form full rings. In an embodiment, the first polymer layer and the second polymer layer are formed of a same polymer material, and the patterning the second polymer layer stops on the first polymer layer. In an embodiment, the first polymer layer and the second polymer layer are formed of different polymer materials. In an embodiment, the method further comprises baking the first polymer layer after the first polymer layer is patterned and before the plurality of redistribution lines are formed. In an embodiment, after the second polymer layer is patterned, all redistribution lines in the wafer and at a same level as the plurality of redistribution lines are covered by the remaining portions of the second polymer layer. In an embodiment, the remaining portions of the second polymer layer extend laterally beyond edges of respective underlying one of the plurality of redistribution lines. In an embodiment, the plurality of redistribution lines comprise a first redistribution line and a second redistribution line neighboring each other and having a first spacing, wherein a first remaining portion of the second polymer layer extends from the first redistribution line to the second redistribution line, and the first remaining portion covers portions of the first redistribution line and the second redistribution line. In an embodiment, the method further comprises forming a third redistribution line and a fourth redistribution line neighboring each other and having a second spacing greater than the first spacing, wherein a second remaining portion and a third remaining portion of the second polymer layer cover the third redistribution line and the fourth redistribution line, respectively, and wherein the second remaining portion and the third remaining portion are discrete portions separated from each other. In an embodiment, the method further comprises forming a plurality of Under-Bump Metallurgies (UBMs) extending into the remaining portions of the second polymer layer; bonding a package component to electrically couple to the plurality of UBMs through solder regions; and dispensing an underfill to contact sidewalls of the remaining portions of the second polymer layer and a top surface of the first polymer layer.

In accordance with some embodiments of the present disclosure, a method of forming a semiconductor device comprises forming a first polymer layer over an inorganic passivation layer; forming a plurality of redistribution lines, each comprising a first portion over the first polymer layer, and a second portion extending into the first polymer layer, wherein the plurality of redistribution lines are physically separated from each other; coating a second polymer layer over the plurality of redistribution lines; patterning the second polymer layer into a plurality of discrete portions separated from each other, with each of the plurality of discrete portions covering one of the plurality of redistribution lines; and forming a plurality of Under-Bump Metallurgies (UBMs) extending into the plurality of discrete portions of the second polymer layer to contact the plurality of redistribution lines. In an embodiment, the method further comprises sawing through the first polymer layer to form a discrete die, wherein scribe lines of the sawing pass through spacings between the discrete portions of the second polymer layer. In an embodiment, the discrete portions of the second polymer layer cover all redistribution lines that are at a same level as the plurality of redistribution lines. In an embodiment, the discrete portions of the second polymer layer extend beyond edges of respective underlying ones of the plurality of redistribution lines by a distance substantially equal to or greater than a thickness of the second polymer layer.

In accordance with some embodiments of the present disclosure, a semiconductor structure comprises a first package component comprising a dielectric layer; a first polymer layer over the dielectric layer; a plurality of redistribution lines, each comprising a first portion over the first polymer layer, and a second portion extending into the first polymer layer, wherein the plurality of redistribution lines are physically separated from each other; a patterned second polymer layer comprising a plurality of discrete portions separated from each other, with each of the plurality of discrete portions covering one of the plurality of redistribution lines; and a plurality of Under-Bump Metallurgies (UBMs) extending into the plurality of discrete portions of the patterned second polymer layer to contact the plurality of redistribution lines. In an embodiment, all portions of the patterned second polymer layer are spaced apart from edges of the first package component. In an embodiment, the plurality of redistribution lines comprise a first redistribution line and a second redistribution line neighboring each other and having a first spacing, wherein a first remaining portion of the patterned second polymer layer extends from the first redistribution line to the second redistribution line, and the first remaining portion covers the first redistribution line and the second redistribution line. In an embodiment, the structure further comprises a third redistribution line and a fourth redistribution line of the plurality of redistribution lines neighboring each other and having a second spacing greater than the first spacing, wherein a second remaining portion and a third remaining portion of the patterned second polymer layer cover the third redistribution line and the fourth redistribution line, respectively, and wherein the second remaining portion and the third remaining portion are discrete portions separate from each other. In an embodiment, the structure further comprises a second package component bonded to the first package component; and an underfill encircling, and contacting sidewalls of, the plurality of discrete portions of the patterned second polymer layer, wherein the underfill further contacts a top surface of the first polymer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a first package component comprising:
      a dielectric layer;
      a plurality of redistribution lines comprising first portions over and contacting the dielectric layer; and
      a plurality of dielectric features, each covering one of the plurality of redistribution lines, wherein the plurality of dielectric features are spaced apart from each other, and wherein each of the plurality of dielectric features laterally extend beyond edges of corresponding underlying ones of the plurality of redistribution lines in all lateral directions parallel to a major surface of the dielectric layer.

2. The structure of claim 1, wherein each of the plurality of dielectric features laterally extends beyond edges of the plurality of redistribution lines by a distance equal to or greater than a thickness of the plurality of dielectric features.

3. The structure of claim 1 further comprising:
   a plurality of Under-Bump Metallurgies (UBMs) extending into the plurality of dielectric features to contact the plurality of redistribution lines; and
   solder regions on the plurality of UBMs.

4. The structure of claim 1, wherein the plurality of redistribution lines further comprise second portions extending into the dielectric layer.

5. The structure of claim 1, wherein the dielectric layer and the plurality of dielectric features comprise polymers.

6. The structure of claim 1, wherein one of the plurality of redistribution lines comprises:
   a first trace portion; and
   a first pad portion and a second pad portion connecting to opposing ends of the first trace portion, wherein the first pad portion and the second pad portion are wider than the first trace portion.

7. The structure of claim 1, wherein all of the plurality of dielectric features are spaced apart from edges of the first package component.

8. The structure of claim 1, wherein spacings between neighboring ones of the plurality of dielectric features are greater than about 10 nm.

9. The structure of claim 1, wherein:
   the plurality of redistribution lines comprise a first redistribution line and a second redistribution line neighboring each other; and
   the plurality of dielectric features comprise a first dielectric feature and a second dielectric feature covering the first redistribution line and the second redistribution line, respectively, and the structure further comprises an additional dielectric feature connecting the first dielectric feature to the second dielectric feature.

10. The structure of claim 9, wherein each of the first dielectric feature and the second dielectric feature comprises a first round part and a second round part, respectively, and the additional dielectric feature is narrower than, and is joined to, the first round part and the second round part.

11. The structure of claim 1 further comprising:
    a second package component bonded to the first package component; and
    an underfill between the first package component and the second package component, wherein the underfill encircles, and contacts sidewalls of, the plurality of dielectric features, and wherein the underfill separates the plurality of dielectric features from each other.

12. A structure comprising:
    a first package component comprising:
       a polymer layer;
       a plurality of redistribution lines, each comprising a first portion over the polymer layer, and a second portion extending into the polymer layer;
       a plurality of polymer features, wherein each of the plurality of polymer features covers one of the plurality of redistribution lines;
    a second package component bonded to the first package component; and
    an underfill between the first package component and the second package component, wherein the underfill comprises first portions extending between the plurality of polymer features to contact the polymer layer.

13. The structure of claim 12, wherein the underfill further comprises second portions over and contacting top surfaces of the plurality of polymer features.

14. The structure of claim 12 further comprising:
    a plurality of Under-Bump Metallurgies (UBMs) extending into the plurality of polymer features to contact the plurality of redistribution lines; and
    solder regions joining the plurality of UBMs to the second package component.

15. The structure of claim 12, wherein the plurality of polymer features extend beyond edges of respective underlying ones of the plurality of redistribution lines by distances equal to or greater than thicknesses of the plurality of polymer features.

16. A structure comprising:
    a polymer layer;
    a plurality of redistribution lines comprising first portions over and contacting the polymer layer, wherein each of the first portions comprises:

a first pad portion; and a first trace portion connecting to the first pad portion, wherein the first trace portion is narrower than the first pad portion; and a plurality of polymer features covering the plurality of redistribution lines, wherein each of the plurality of polymer features comprises:

a second pad portion larger than the first pad portion of a respective underlying one of the plurality of redistribution lines; and a second trace portion connecting to the second pad portion, wherein the second trace portion is narrower than the second pad portion, and the second trace portion covers the first trace portion, and extends beyond edges of the first trace portion.

17. The structure of claim 16, wherein the first pad portion and the second pad portion have circular top-view shapes.

18. The structure of claim 16, wherein the second pad portion extends beyond edges of the first pad portion in all lateral directions, and the all lateral directions are parallel to interfaces between the polymer layer and the plurality of polymer features.

19. The structure of claim 16, wherein the plurality of polymer features are spaced apart from each other.

20. The structure of claim 19 further comprising an underfill extending between the plurality of polymer features.

\* \* \* \* \*